US009054325B2

(12) United States Patent
Benedito et al.

(10) Patent No.: US 9,054,325 B2
(45) Date of Patent: *Jun. 9, 2015

(54) RYLENE MONOIMIDE DERIVATIVES AND USE THEREOF AS PHOTOSENSITIZERS IN SOLAR CELLS AND PHOTODETECTORS

(71) Applicant: BASF SE, Ludwigshafen (DE)

(72) Inventors: Flavio Luiz Benedito, Ludwigshafen (DE); Ingmar Bruder, Mutterstadt (DE); Peter Erk, Frankenthal (DE); Neil Gregory Pschirer, Island South (HK); Robert Send, Karlsruhe (DE); Klaus Muellen, Cologne (DE); Henrike Wonneberger, Mannheim (DE); Chen Li, Cologne (DE)

(73) Assignees: 03;BASF SE, Ludwigshafen (DE); Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 102 days.

This patent is subject to a terminal disclaimer.

(21) Appl. No.: 13/762,764

(22) Filed: Feb. 8, 2013

(65) Prior Publication Data
US 2013/0207056 A1    Aug. 15, 2013

Related U.S. Application Data

(60) Provisional application No. 61/596,750, filed on Feb. 9, 2012.

(51) Int. Cl.
F21V 9/00         (2006.01)
G02B 5/02         (2006.01)
(Continued)

(52) U.S. Cl.
CPC ............. *H01L 51/44* (2013.01); *H01G 9/2059* (2013.01); *H01L 51/0053* (2013.01);
(Continued)

(58) Field of Classification Search
USPC ............ 136/263; 252/501.1, 582; 546/26, 31, 546/38; 548/417
See application file for complete search history.

(56) References Cited

U.S. PATENT DOCUMENTS 4,927,721 A     5/1990   Gratzel et al.
5,350,644 A     9/1994   Graetzel et al.
(Continued)

FOREIGN PATENT DOCUMENTS

CN      101351524 A     1/2009
CN      101384655 A     3/2009
(Continued)

OTHER PUBLICATIONS

Brian O'Regan, et al., "A low-cost, high-efficiency solar cell based on dye-sensitized colloidal $TiO_2$ films", Letters to Nature, vol. 353, Oct. 24, 1991, pp. 737-740.
(Continued)

Primary Examiner — Bijan Ahvazi
(74) Attorney, Agent, or Firm — Oblon, McClelland, Maier & Neustadt, L.L.P.

(57) ABSTRACT

Thin layers or films of metal oxides are used as a semiconductor material of solar cells and they are coated with a sensitizer to achieve the high absorption of sunlight. Various dyes have been used as sensitizers in solar cells. Rylene monoimide derivatives are developed as photosensitizers for dye-sensitized solar cells and as photodetectors. The Rylene monoimide derivatives have very good quantum efficiencies, particularly in the NIR region of the absorption spectrum.

9 Claims, 13 Drawing Sheets

Figure 1:
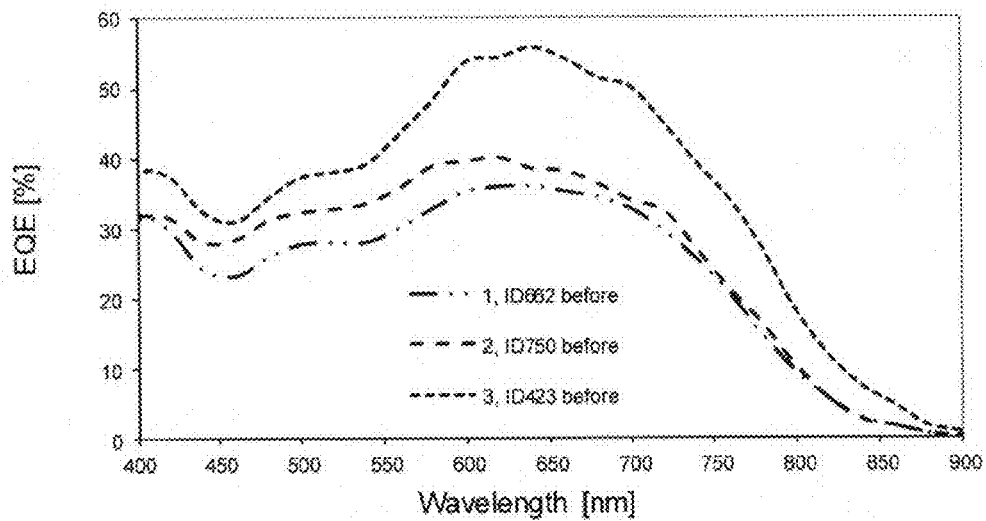

(51) Int. Cl.

| | |
|---|---|
| *G02C 7/10* | (2006.01) |
| *G02F 1/361* | (2006.01) |
| *G03B 11/00* | (2006.01) |
| *H01L 51/44* | (2006.01) |
| *H01G 9/20* | (2006.01) |
| *H01L 51/00* | (2006.01) |
| *C09B 67/00* | (2006.01) |
| *H01C 13/00* | (2006.01) |
| *H01L 51/42* | (2006.01) |

(52) U.S. Cl.
CPC ........ *H01L 51/0061* (2013.01); *H01L 51/0068* (2013.01); *H01L 51/0072* (2013.01); *Y02E 10/542* (2013.01); *H01L 51/4226* (2013.01); *Y02E 10/549* (2013.01)

(56) References Cited

U.S. PATENT DOCUMENTS

| | | | |
|---|---|---|---|
| 6,359,211 | B1 | 3/2002 | Spitler et al. |
| 8,231,809 | B2 | 7/2012 | Pschirer et al. |
| 8,501,046 | B2 * | 8/2013 | Pschirer et al. .......... 252/501.1 |
| 2008/0269482 | A1 | 10/2008 | Pschirer et al. |
| 2009/0166614 | A1 | 7/2009 | Könemann et al. |
| 2011/0068328 | A1 | 3/2011 | Köenemann et al. |
| 2012/0165530 | A1 | 6/2012 | Pschirer et al. |
| 2012/0283432 | A1 | 11/2012 | Pschirer et al. |

FOREIGN PATENT DOCUMENTS

| | | |
|---|---|---|
| CN | 101809116 A | 8/2010 |
| EP | 1 176 646 A1 | 1/2002 |
| JP | 10-189065 | 7/1998 |
| JP | 10-334954 | 12/1998 |
| JP | 2000-100484 | 4/2000 |
| JP | 2000-243463 | 9/2000 |
| JP | 2001-93589 | 4/2001 |
| WO | WO 2007/054470 A1 | 5/2007 |
| WO | WO 2008/132103 A1 | 11/2008 |
| WO | WO 2012/085803 A1 | 6/2012 |

OTHER PUBLICATIONS

U. Bach, et al., "Solid-state dye-sensitized mesoporous $TiO_2$ solar cells with high photon-to-electron conversion efficiencies", Letters to Nature, vol. 395, Oct. 8, 1998, pp. 583-585.

Suzanne Ferrere, et al., "New perylenes for dye sensitization of $TiO_2$", New J. Chem., vol. 26, 2002, pp. 1155-1160.

Chen Li, et al., "An Improved Perylene Sensitizer for Solar Cell Applications", Chemsuschem, vol. 1, 2008, pp. 615-618.

Ute B. Cappel, et al., "A Broadly Absorbing Perylene Dye for Solid-State Dye-Sensitized Solar Cells", The Journal of Physical Chemistry C Letters, vol. 113, No. 33, 2009, pp. 14595-14597.

Evelyn Cuevas Creencia, et al., "Microwave-Assisted Cadogan Reaction for the Synthesis of 2-Aryl-2*H*-indazoles, 2-Aryl-1*H*-benzimidazoles, 2-Carbonylindoles, Carbazole, and Phenazine", Journal of Heterocyclic Chemistry, vol. 46, 2009, pp. 1309-1317.

Adam W. Freeman, et al., "Triphenylphosphine-Mediated Reductive Cyclization of 2-Nitrobiphenyls: A Practical and Convenient Synthesis of Carbazoles", J. Org. Chem., vol. 70, No. 13, 2005, pp. 5014-5019.

Wei Jiang, et al., "Heteroatom-Annulated Perylenes: Practical Synthesis, Photophysical Properties, and Solid-State Packing Arrangement", J. Org. Chem., vol. 73, No. 18, 2008, pp. 7369-7372.

R. Asami, et al., "60. Benzylsodium and Cumylpotassium as Initiators of Polymerization", Journal of the Chemical Society, Part 1, 1962, p. 361.

J. S. Driscoll, et al., "A Phosphonium Borohydride Reducing Agent", Chemistry and Industry, Aug. 3, 1963, p. 1282.

International Search Report issued Jul. 11, 2013 in PCT/IB2013/050996.

* cited by examiner

RYLENE MONOIMIDE DERIVATIVES AND USE THEREOF AS PHOTOSENSITIZERS IN SOLAR CELLS AND PHOTODETECTORS

The present invention relates to compounds of the formulae Ia, Ib and Ic

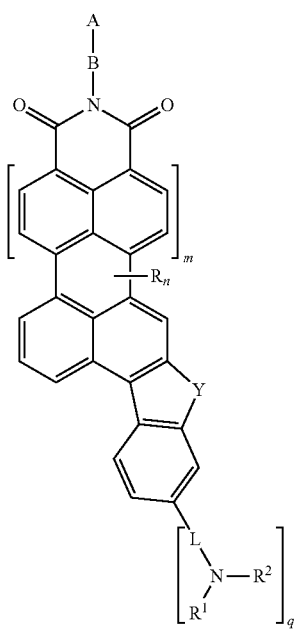
(Ia)

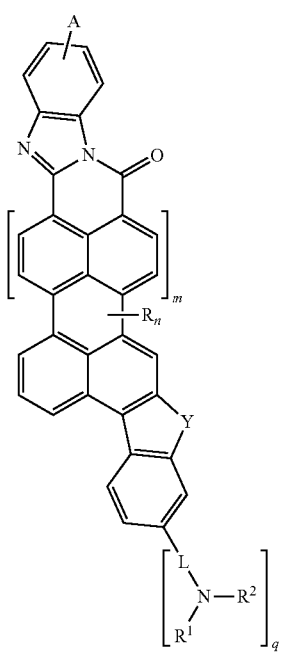
(Ib)

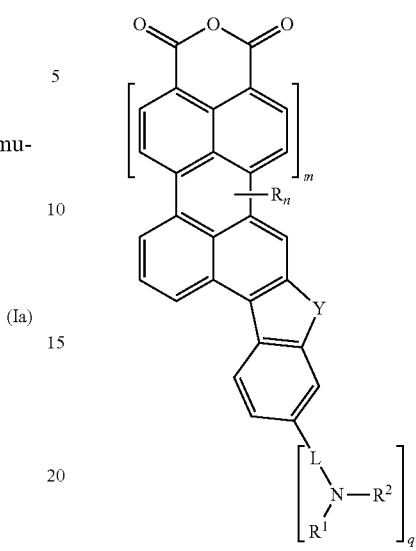
(Ic)

in which

R are identical or different aryloxy, arylthio, hetaryloxy, hetarylthio, aryl, diarylamino or dialkylamino radicals, n when m is 0: 0, 1, 2 or 3,
 when m is 1: 0, 1, 2, 3, 4 or 5, m is 0 or 1, A is —COOM, —$SO_3M$ or —$PO_3M$, M is hydrogen, an alkali metal cation or $[NR']^{4+}$, R' is hydrogen or alkyl, where the R' radicals may be the same or different, B is $C_1$-$C_6$-alkylene or 1,4-phenylene, where the phenylene radical may be mono- or polysubstituted by alkyl, nitro, cyano and/or halogen, L is a chemical single bond or a bridge of the formula -(Het)Ar— or -(Het)Ar-(Het)Ar— which may be mono- or polysubstituted by phenyl, alkyl, alkoxy, alkylthio and/or —$NR^4R^5$ and in which (Het)Ar is aryl or hetaryl which may be fused to saturated or unsaturated 5- to 18-membered rings which may comprise heteroatoms, where, in the case of two (Het)Ar, these may be the same or different, q is 0 or 1, $R^1$, $R^2$ are each independently radicals of the formula IIa, IIb or IIc

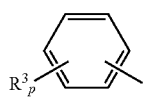
(IIa)

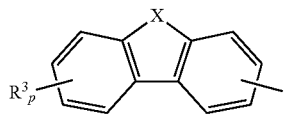
(IIb)

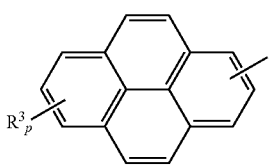

(IIc)

$R^3$ is phenyl, alkyl, alkoxy, alkylthio or $-NR^6R^7$,

X is $C(R^8R^9)_2$, $NR^{10}$, oxygen or sulfur, $R^4$ to $R^{10}$ are each independently hydrogen, alkyl whose carbon chain may be interrupted by one or more $-O-$, $-S-$, $-CO-$, $-SO-$ and/or $-SO_2-$ moieties, or aryl or hetaryl, each of which may be mono- or polysubstituted by alkyl, alkoxy and/or alkylthio, p is 0, 1, 2, 3, 4 or 5, Y is $NR^{11}$ or sulfur, and $R^{11}$ is hydrogen, alkyl whose carbon chain may be interrupted by one or more $-O-$, $-S-$, $-CO-$, $-SO-$ and/or $-SO_2-$ moieties, or aryl, hetaryl, aralkyl or hetaralkyl.

The present invention further relates to the use of compounds of the formulae Ia, Ib and Ic or mixtures of compounds of the formulae Ia, Ib and Ic and/or isomers thereof or mixtures of isomers of the compounds of the formulae Ia, Ib and Ic as photosensitizers in solar cells and photodetectors, and to solar cells and photodetectors comprising compounds of the formulae Ia, Ib and Ic or mixtures of compounds of the formulae Ia, Ib and Ic and/or isomers thereof or mixtures of isomers of the compounds of the formulae Ia, Ib and Ic photosensitizers.

The direct conversion of solar energy to electrical energy in solar cells is based on the internal photoeffect of a semiconductor material, i.e. the generation of electron-hole pairs by absorption of photons and the separation of the negative and positive charge carriers at a p-n junction or a Schottky contact. The photovoltage thus generated can bring about a photocurrent in an external circuit, through which the solar cell delivers its power.

The semiconductor can absorb only those photons which have an energy which is greater than its band gap. The size of the semiconductor band gap thus determines the fraction of sunlight which can be converted to electrical energy.

Thin layers or films of metal oxides are known to constitute inexpensive solid semiconductor materials (n-semiconductors), but their absorption, owing to large band gaps, is typically not within the visible region of the electromagnetic spectrum. For use in solar cells, the metal oxides therefore have to be combined with a photosensitizer which absorbs in the wavelength range of sunlight, i.e. at from 300 to 2000 nm, and, in the electronically excited state, injects electrons into the conduction band of the semiconductor. With the aid of a redox system which is used additionally in the cell and is reduced at the counterelectrode, electrons are recycled to the sensitizer which is thus regenerated.

Of particular interest for use in solar cells are the semiconductors zinc oxide, tin dioxide and especially titanium dioxide, which are used in the form of nanocrystalline porous layers. These layers have a large surface area which is coated with the sensitizer, so that high absorption of sunlight is achieved.

Dye-sensitized solar cells which are based on titanium dioxide as the semiconductor material are described, for example, in U.S. Pat. No. 4,927,721, Nature 353, p. 737-740 (1991) and U.S. Pat. No. 5,350,644, and also Nature 395, p. 583-585 (1998) and EP-A-1 176 646. These solar cells comprise monomolecular films of transition metal complexes, especially ruthenium complexes, which are bonded to the titanium dioxide layer via acid groups, as sensitizers and iodine/iodide redox systems present in dissolved form or amorphous organic p-conductors based on spirobifluorenes.

Also proposed repeatedly as sensitizers, not least for reasons of cost, have been metal-free organic dyes.

For example, U.S. Pat. No. 6,359,211 describes, for this purpose, cyanine, oxazine, thiazine and acridine dyes which have carboxyl groups bonded via an alkylene radical for securing to the titanium dioxide semiconductor.

Dyes with naphthalene monoimide anchor groups are described in the document WO 2008/132103 A1, but these compounds absorb in the short-wave spectral region of sunlight (absolute maximum at about 450 nm) and are therefore unsuitable for efficient absorption and conversion of sunlight.

Perylene-3,4:9,10-tetracarboxylic acid derivatives as sensitizers are examined in Japanese documents JP-A-10-189065, 2000-243463, 2001-093589, 2000-100484 and 10-334954, and in New J. Chem. 26, p. 1155-1160 (2002). The liquid electrolyte solar cells based on these perylene derivatives, however, exhibited much lower efficiencies than a solar cell sensitized with a ruthenium complex for comparison.

The document WO 2007/054470 A1 and the publications by Chen Li et al. in ChemSusChem, Vol. 1, 615-618, 2008 and Ute B. Cappel et al in J. of Phys. Chem. C Letters, Vol. 113, No. 33, 14595-14597, 2009 describe substituted rylene and perylene derivatives for use as sensitizers.

It has now been found that, surprisingly, compounds of the formulae Ia, Ib and Ic of the present invention have very good quantum efficiencies, particularly in the NIR region of the absorption spectrum.

Accordingly, the compounds of the formulae Ia, Ib and Ic detailed at the outset have been found, as has the use thereof as photosensitizers in solar cells and photodetectors.

In the context of the present invention, aryl is especially a radical with a base skeleton of 6 to 30 carbon atoms, preferably 6 to 18 carbon atoms, which is formed from one aromatic ring or a plurality of fused aromatic rings. Suitable base skeletons are, for example, phenyl, benzyl, naphthyl, anthracenyl or phenanthrenyl. This base skeleton may be unsubstituted, which means that all carbon atoms which are substitutable bear hydrogen atoms, or substituted at one, more than one or all substitutable positions of the base skeleton. Suitable substituents are, for example, alkyl radicals, preferably alkyl radicals having 1 to 8 carbon atoms, more preferably methyl, ethyl, i-propyl or t-butyl, aryl radicals, preferably $C_6$-aryl radicals, which may in turn be substituted or unsubstituted, heteroaryl radicals, preferably heteroaryl radicals which comprise at least one nitrogen atom, more preferably pyridyl radicals, alkenyl radicals, preferably alkenyl radicals which bear a double bond, more preferably alkenyl radicals with one double bond and 1 to 8 carbon atoms, or groups with donor or acceptor action. Groups with donor action are understood to mean groups which have a +I and/or +M effect, and groups with acceptor action are understood to mean groups which have a −I and/or −M effect. Suitable groups with donor or acceptor action are halogen radicals, preferably F, Cl, Br, more preferably F, alkyl radicals, alkoxy radicals, aryloxy radicals, carbonyl radicals, ester radicals, amine radicals, amide radicals, $CH_2F$ groups, $CHF_2$ groups, $CF_3$ groups, CN groups, thio groups or SCN groups. The aryl radicals most preferably bear substituents selected from the group consisting of methyl, ethyl, iso-propyl, n-propyl, n-butyl, iso-butyl, tert-butyl, aryloxy, amine, thio groups and alkoxy, or the aryl radicals are unsubstituted. The aryl radical or the aryl group is preferably a phenyl radical which is optionally substituted by at least one of the aforementioned substituents. The phenyl radical more preferably has none, one, two or three of the aforementioned substituents.

In the context of the present invention, hetaryl is a radical which has 5 to 30, preferably 5 to 18, carbon atoms and heteroatoms and differs from the aforementioned aryl radicals in that at least one carbon atom in the base skeleton of the aryl radicals is replaced by a heteroatom. Preferred heteroatoms are N, O and S. Most preferably, one or two carbon atoms of the base skeleton of the aryl radicals are replaced by heteroatoms. The base skeleton is especially preferably selected from systems such as pyridyl, pyrimidyl, pyrazyl and triazolyl, and five-membered heteroaromatics such as pyrrole, furan, thiophene, imidazole, pyrazole, triazole, oxazole and thiazole. The base skeleton may be substituted at one, more than one or all substitutable positions of the base skeleton. Suitable substituents are the same as have already been mentioned for the aryl groups.

In the context of the present invention, the aryloxy, arylthio, hetaryloxy and hetarylthio radicals derive in a formal sense from the aforementioned aryl and heteroaryl radicals by attachment of an oxygen or sulfur atom to a carbon atom of the aryl or heteroaryl radical.

In the context of the present invention, alkyl is especially a radical having 1 to 20 carbon atoms, preferably 1 to 12 carbon atoms. This alkyl radical may be branched or unbranched and optionally be interrupted by one or more —O—, —S—, —CO—, —SO— and/or —SO$_2$— moieties. Alkyl is more preferably selected from the group consisting of methyl, ethyl, i-propyl, n-propyl, i-butyl, n-butyl, t-butyl, sec-butyl, i-pentyl, n-pentyl, sec-pentyl, neopentyl, n-hexyl, i-hexyl and sec-hexyl.

In the context of the present invention, aralkyl and hetaralkyl include especially aryl- and hetaryl-$C_1$-$C_{20}$-alkyl groups. They derive from the alkyl and aryl groups detailed above by formal replacement of a hydrogen atom of the linear or branched alkyl chain by an aryl or hetaryl group. For example, suitable aralkyl groups be benzyl, ethylphenyl, n-propylphenyl and n-butylphenyl, and as hetaralkyl the moiety of the formula

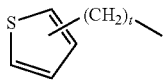

in which t is especially the values of 1, 2, 3 and 4.

In the context of the present invention, alkoxy and alkylthio radicals derive in a formal sense from the aforementioned alkyl radicals by attachment of an oxygen or sulfur atom to a carbon atom of the alkyl radical.

In the context of the present invention, halogen is preferably F, Cl or Br, more preferably F.

In the context of the present invention, alkali metal cation is preferably Li, Na, Cs or K, more preferably Na.

When the bridge L is mono- or polysubstituted by phenyl, alkyl, alkoxy, alkylthio and/or —NR$^4$R$^5$, this means that these substituents are attached to suitable positions on the aromatic and heteroaromatic Ar groups.

When the bridge L comprises two (Het)Ar, they may be the same or different.

Examples of suitable (Het)Ar include 1,4-, 1,3- and 1,2-phenylene, 1,4- and 1,8-naphthylene, 1,4- and 2,3-pyrrylene, 2,5-, 2,4- and 2,3-thienylene, 2,5-, 2,4- and 2,3-furanylene, 2,3-, 2,4-, 2,5-, 2,6-, 3,4- and 3,5-pyridinylene, 2,3-, 2,5-, 2,6-, 3,7-, 4,8-, 5,8- and 6,7-quinolinylene, 2,7-, 3,6-, 4,5-, 2,6-, 3,7-, 4,7- and 4,8-isoquinolinylene, 1,4-[2,5-di(tert-butyl)]phenylene, 1,4-(2,5-dihexyl)phenylene, 1,4-[2,5-di(tert-octyl)]phenylene, 1,4-(2,5-didodecyl)phenylene and 1,4-[2,5-di(2-dodecyl)]phenylene. Especially useful as (Het)Ar are 1,4-phenylene and 2,5-thienylene.

Further suitable bridges L are, for example:

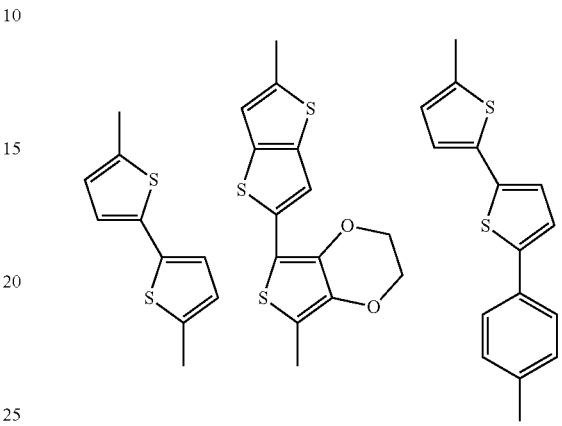

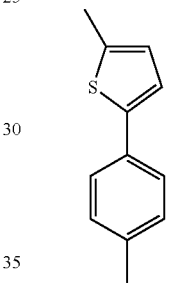

preferably:

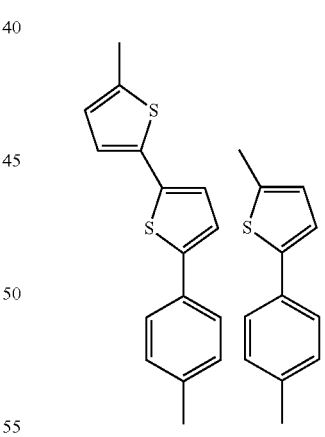

Preference is given to inventive compounds in which, in the formulae Ia, Ib and Ic:
R are identical or different aryloxy or arylthio radicals,
n when m is 0 or m is 1: 0, 1 or 2,
m is 0 or 1,
A is —COOM,
M is hydrogen or an alkali metal cation,
B is $C_1$-$C_6$-alkylene,
L is a chemical single bond or a bridge of the formula -(Het)Ar— or -(Het)Ar-(Het)Ar— which may be mono- or polysubstituted by phenyl, $C_1$-$C_{12}$-alkyl, $C_1$-$C_{12}$-alkoxy, $C_1$-$C_{12}$-alkylthio and/or —$NR^4R^5$, and in which (Het)Ar is identical or different aryl or hetaryl which may be fused to saturated or unsaturated 5- to 18-membered rings which may comprise heteroatoms, q is 0 or 1, $R^4$, $R^5$ are each independently hydrogen or $C_1$-$C_{12}$-alkyl whose carbon chain may be interrupted by one or more —O—, —S—, —CO—, —SO— and/or —$SO_2$— moieties, $R^1$, $R^2$ are each independently radicals of the formulae II'a, II'b or II'c

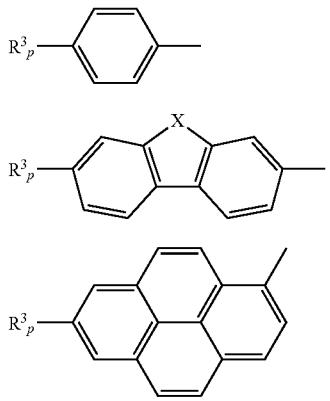

$R^3$ is $C_1$-$C_{12}$-alkoxy,
p is 0 or 1,
X is $C(R^8R^9)_2$, $NR^{10}$, oxygen or sulfur,
$R^8$, $R^9$, $R^{10}$ are each independently hydrogen or $C_1$-$C_{12}$-alkyl whose carbon chain may be interrupted by one or more —O—, —S—, —CO—, —SO— and/or —$SO_2$— moieties,
Y is $NR^{11}$ or sulfur,
and
$R^{11}$ is hydrogen or $C_1$-$C_{12}$-alkyl whose carbon chain may be interrupted by one or more —O—, —S—, —CO—, —SO— and/or —$SO_2$— moieties.

Particular preference is given to inventive compounds in which, in the formulae Ia, Ib and Ic:
n is 0,
m is 0 or 1,
A is —COOM,
M is hydrogen or an alkali metal cation,
B is $C_1$-$C_6$-alkylene,
L is a chemical single bond or a bridge of the formula -(Het)Ar— or -(Het)Ar-(Het)Ar— in which (Het)Ar is identical or different aryl or hetaryl,
q is 0 or 1,
$R^1$, $R^2$ are each independently radicals of the formulae II'a, II'b or II'c

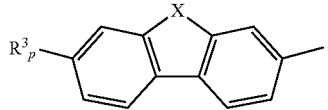

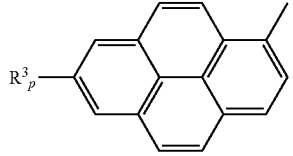

$R^3$ is $C_1$-$C_{12}$-alkoxy,
p is 0 or 1,
X is $C(R^8R^9)_2$ or $NR^{10}$,
$R^8$, $R^9$, $R^{10}$ are each independently hydrogen or $C_1$-$C_{12}$-alkyl whose carbon chain may be interrupted by one or more —O—, —S—, —CO—, —SO— and/or —$SO_2$— moieties,
Y is $NR^{11}$ or sulfur,
and $R^{11}$ is hydrogen or $C_1$-$C_{12}$-alkyl.

The invention shall encompass not just the compounds of the formulae Ia, Ib and Ic and the preferred embodiments thereof, but also mixtures thereof, isomers thereof and the mixtures of the isomers.

For example, the invention also includes isomeric compounds of the formula I*b shown below

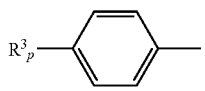

In the context of the present invention, also claimed is the use of the aforementioned compounds of the formulae Ia, Ib and Ic or mixtures of compounds of the formulae Ia, Ib and Ic and the preferred embodiments thereof and/or the use of isomers thereof or mixtures of the isomers of the compounds of the formulae Ia, Ib and Ic and the preferred embodiments thereof as photosensitizers in solar cells and photodetectors.

In the context of the present invention, additionally claimed are solar cells and photodetectors which comprise

EXAMPLES

1.) Synthesis of the Inventive Compound (PS1)

(PS1)

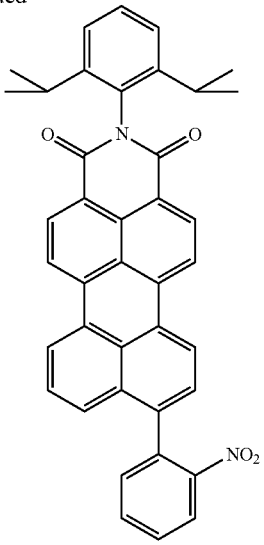

a) Synthesis of N-(2,6-diisopropylphenyl)-9-(2-nitrophenyl)-3,4-perylenedicarboximide

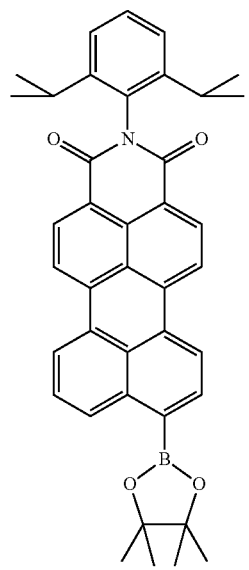
→

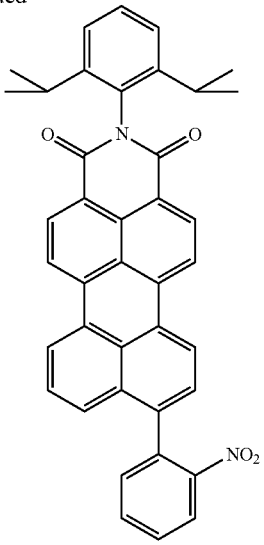

In a Schlenk tube, 500 mg of N-(2,6-diisopropylphenyl)-9-(4,4,5,5-tetramethyl-1,3,2-dioxaborolan-2-yl)-3,4-perylenedicarboximide (0.824 mmol) and 247 mg of 1-bromo-2-nitrobenzene (1.235 mmol) were dissolved in 40 mL of toluene, and 800 mg (5.797 mmol) of potassium carbonate and 800 mg of potassium carbonate in 4 mL of water and 0.4 mL of ethanol were added. After degassing the reaction solution with argon, 184 mg of tetrakis(triphenylphosphine)palladium(0) (0.165 mmol) were added, and the mixture was degassed again and stirred at 80° C. under argon overnight.

The reaction solution was cooled to room temperature and extracted with water and dichloromethane. The reaction mixture was separated by column chromatography on silica gel by means of dichloromethane.

Yield: 203 mg (41%) of red dye.

b) Synthesis of N-(2,6-diisopropylphenyl)-8,9-([b]-1-hexyl-1H-indole)-3,4-perylenedicarboximide

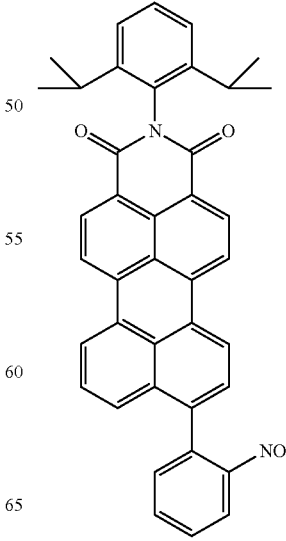
→

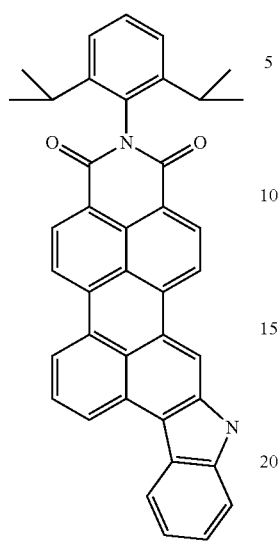

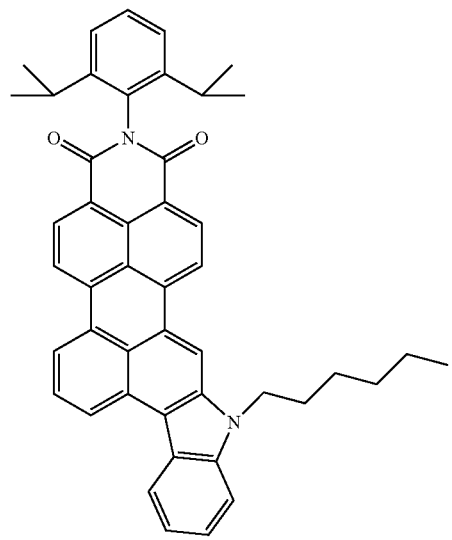

The synthesis was based on syntheses known from the literature (J. of Heterocyclic Chem. 46, 1309-1317, 2009; J. Org. Chem., 70, 5014-5019, 2005; J. Org. Chem. 73, 7369-7372, 2008, Proc. Chem. Soc., 361, 1962; Chem.- and Ind., 1282, 1963).

500 mg of N-(2,6-diisopropylphenyl)-9-(2-nitrobenzyl)-3,4-perylenedicarboximide (0.830 mmol) and 650 mg of triphenylphosphine (2.48 mmol) were dissolved in 15 mL of o-dichlorobenzene and stirred in a microwave at 182° C. and 300 W over the course of 8 h. The precipitated product was filtered off and used further without further purification.

Yield (crude): 320 mg (68%) of dark violet dye c) Synthesis of N-(2,6-diisopropylphenyl)-8,9-([b]-1-hexyl-1H-indole)-3,4-perylenedicarboximide 210 mg of N-(2,6-diisopropylphenyl)-8,9-([b]-1H-indole)-3,4-perylenedicarboximide (0.368 mmol) and 12 mg of sodium hydride (0.478 mmol) were introduced into a Schlenk tube and evacuated. 15 mL of anhydrous DMF were added under argon. The solution was stirred at room temperature for 30 minutes (color change from violet to blue). After the addition of 122 mg of bromohexane (0.736 mmol), the solution was stirred for a further 3 h (color change back to violet).

The reaction was quenched with water, extracted with dichloromethane and water/hydrochloric acid (3:1) and dried over magnesium sulfate. The violet crude product was purified by means of column chromatography on silica gel with dichloromethane.

Yield: 128 mg (53%) of violet solid.

d) Synthesis of 8,9-([b]-1-hexyl-1H-indole)-3,4-perylenedicarboxylic anhydride

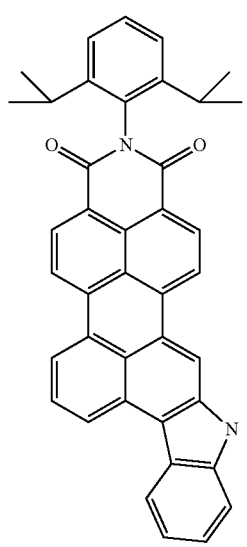 →

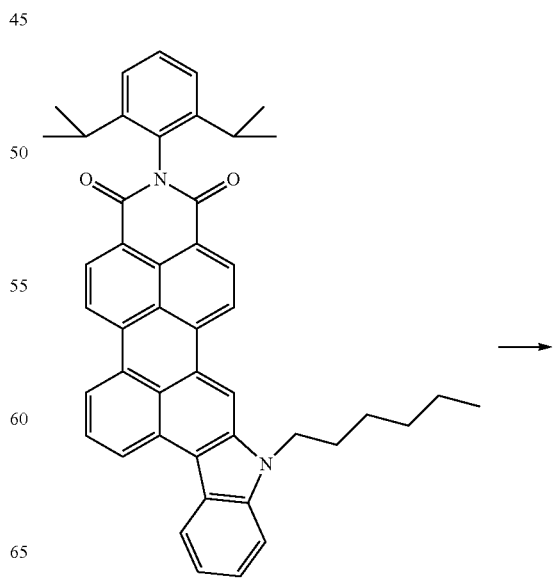 →

-continued

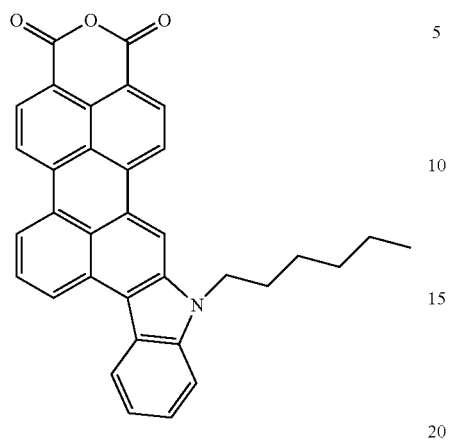

110 mg of N-(2,6-diisopropylphenyl)-8,9-([b]-1-hexyl-1H-indole)-3,4-perylenedicarboximide (0.168 mmol) were dissolved in 10 mL of 2-methyl-2-butanol, 375 mg of potassium hydroxide (6.7 mmol) were added, and the mixture was degassed and boiled under reflux overnight.

After cooling, the reaction solution was added to ice in diluted acetic acid (1:10 acetic acid:water). The precipitate was filtered off, washed with water and dissolved in dichloromethane. A few drops of acetic acid were added to the solution which was stirred overnight. The anhydride formed (N-(2,6-diisopropylphenyl)-8,9-([b]-1-hexyl-1H-indole)-3,4-dicarboxylic monoanhydride) was converted further in crude form.

Yield (crude): 80 mg (96%) of dark violet solid e) Synthesis of the Target Compound

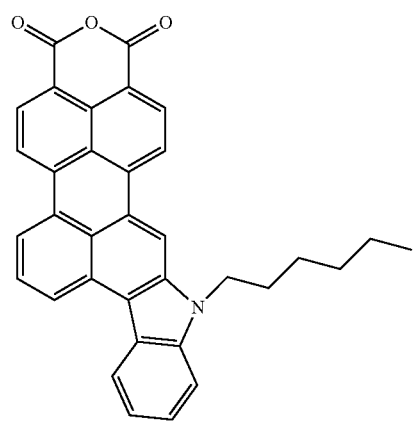 

-continued

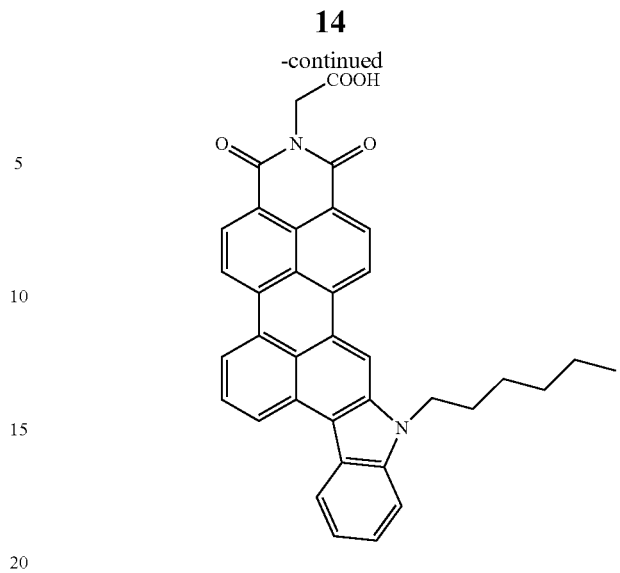

80 mg of a crude anhydride (0.161 mmol) were introduced into a Schlenk tube with 1 g of glycine (13.4 mmol) and 2 g of imidazole (29.4 mmol). After degassing, the mixture was stirred at 140° C. under argon overnight.

After cooling, the crude product was dissolved out of the flask by means of dilute hydrochloric acid (1:5 hydrochloric acid:water). The precipitate was filtered off and washed to neutrality. The crude product was purified by means of column chromatography on silica gel with THF and THF:acetic acid (1:1).

Yield: 50 mg (56%) of dark violet solid

2.) Synthesis of the Inventive Compound (PS2)

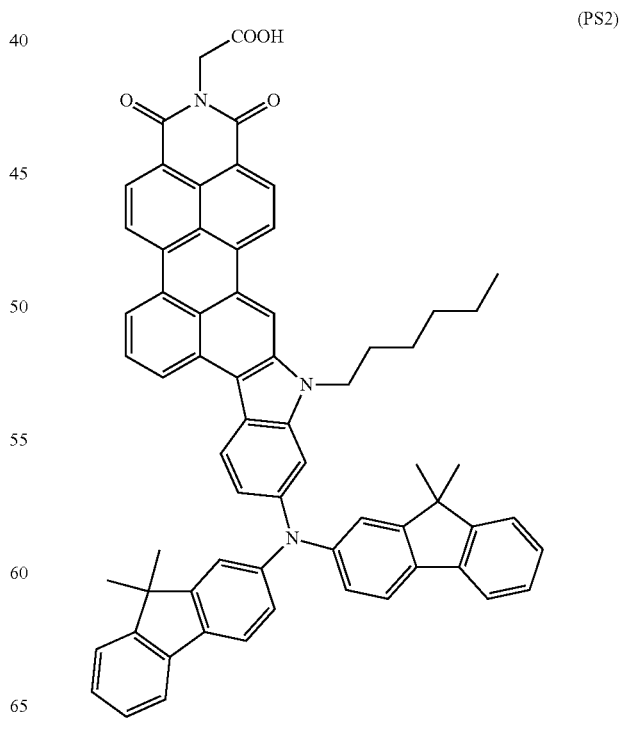

(PS2)

a) Synthesis of N-(2,6-diisopropylphenyl)-9-(4-chloro-2-nitrobenzyl)-3,4-perylenedicarboximide b) Synthesis of N-(2,6-diisopropylphenyl)-9-(4-(bis(9,9-dimethylfluoren-2-yl)amine)-2-nitrophenyl)-3,4-perylenedicarboximide

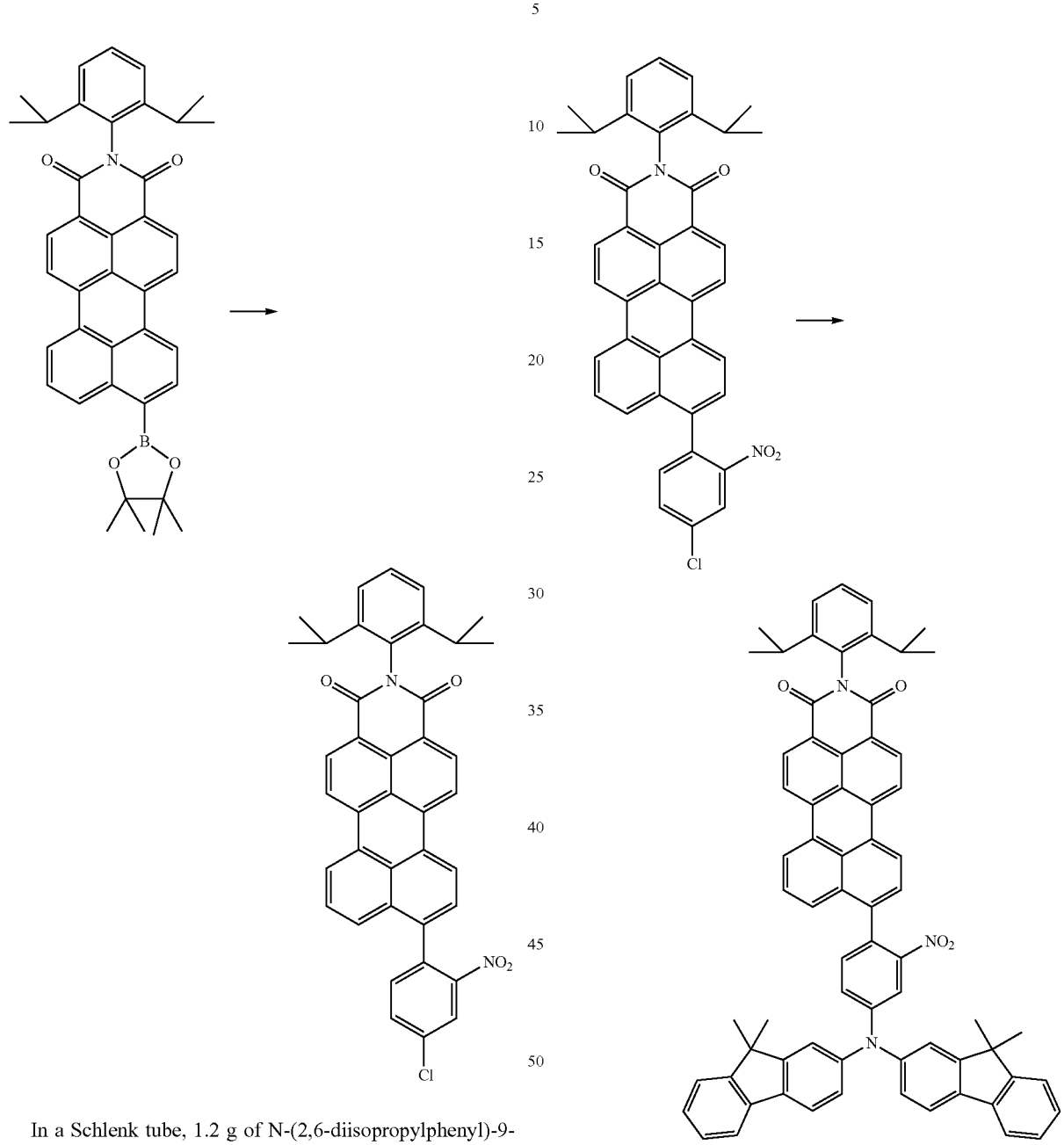

In a Schlenk tube, 1.2 g of N-(2,6-diisopropylphenyl)-9-(4,4,5,5-tetramethyl-1,3,2-dioxaborolan-2-yl)-3,4-perylenedicarboximide (1.98 mmol), 700 mg of 1-bromo-4-chloro-2-nitrobenzene (2.96 mmol) were dissolved in 80 mL of toluene, and 1.6 g of potassium carbonate (11.59 mmol) in 8 mL of water and 0.8 mL of ethanol were added. After the reaction solution had been degassed with argon, 330 mg of tetrakis(triphenylphosphine)palladium(0) (0.296 mmol) were added, and the mixture was degassed again and stirred at 80° C. for 36 h.

The reaction solution was cooled to room temperature and extracted with water and dichloromethane. The reaction mixture was separated by column chromatography on silica gel by means of dichloromethane.

Yield: 1.0 mg (79%) of red solid 750 mg of N-(2,6-diisopropylphenyl)-9-(4-chloro-2-nitrobenzyl)-3,4-perylenedicarboximide (1.18 mmol), 700 mg of bis(9,9-dimethylfluoren-2-yl)amine (1.75 mmol), 760 mg of cesium carbonate (2.33 mmol), 110 mg of tris(dibenzylideneacetone)dipalladium(0) (0.120 mmol) and 145 mg of 2,2''-bis(diphenylphosphino)-1,1''-binaphthyl (0.228 mmol) were dissolved in 30 mL of dry toluene under argon and stirred at 100° C. under argon for 16 h.

The crude mixture was purified by means of column chromatography on silica gel with dichloromethane.

Yield: 770 mg of red solid (65%)

c) Synthesis of N-(2,6-diisopropylphenyl)-8,9-([b]-N,N-bis(9,9-dimethyl-9H-fluoren-2-yl)-1H-indol-6-amine)-3,4-perylenedicarboximide

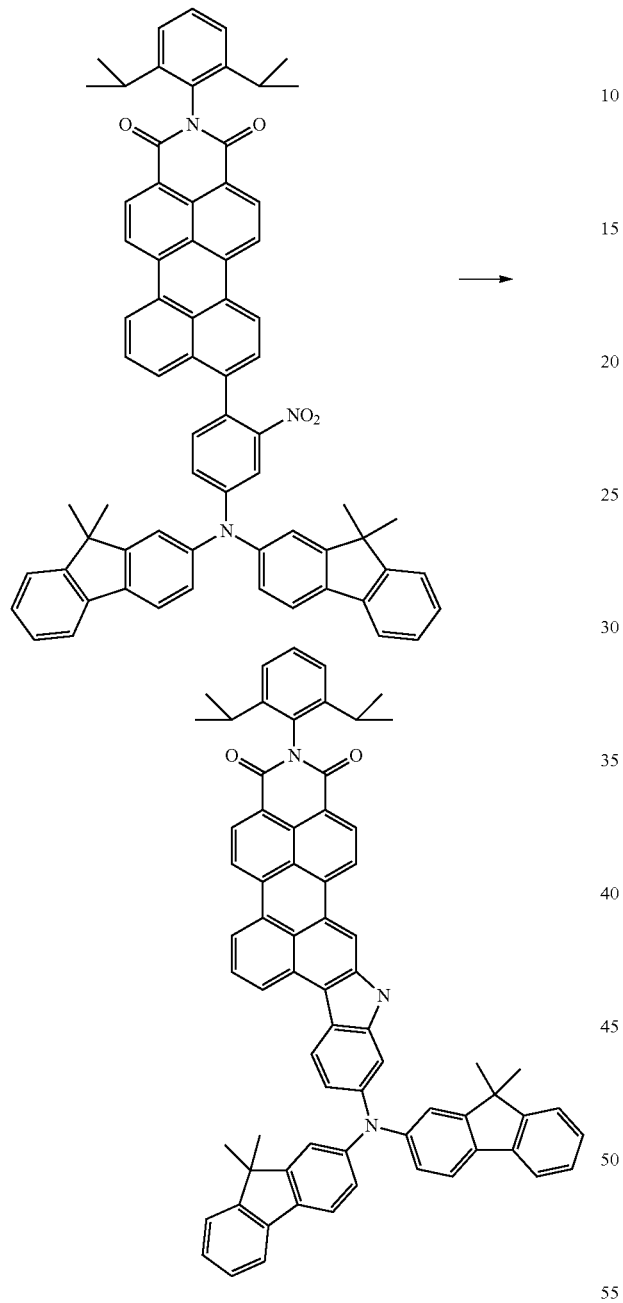

350 mg of N-(2,6-diisopropylphenyl)-9-(4-(bis(9,9-dimethylfluoren-2-yl)amine)-2-nitrobenzyl)-3,4-perylenedicarboximide (0.349 mmol) and 275 mg of triphenylphoshine (1.05 mmol) were dissolved in 10 mL of o-dichlorobenzene and stirred in a microwave at 182° C. and 300 W over the course of 8 h.

Workup A:

The solvent was removed by means of a Kugelrohr still and the reaction mixture was purified by means of column chromatography on silica gel with dichloromethane.

Workup B:

Alternatively, the mixture, after the treatment in the microwave, was precipitated in petroleum ether and stirred at 50° C. for 2 h. The blue precipitate formed was filtered off through a D4 glass frit and washed with petroleum ether until the filtrate became clear. The product formed was clean and could be converted further without purification.

Yield: blue solid: 90% d) Synthesis of N-(2,6-diisopropylphenyl)-8,9-([b]-N,N-bis(9,9-dimethyl-9H-fluoren-2-yl)-1-hexyl-1H-indol-6-amine)-3,4-perylenedicarboximide

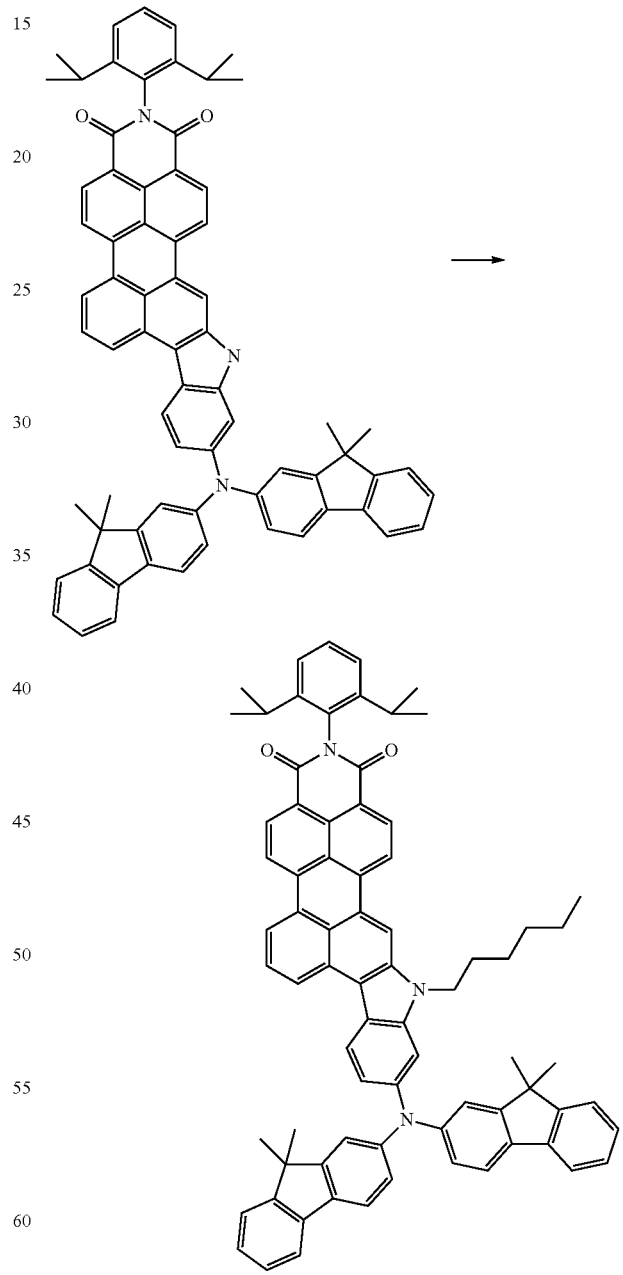

Method A:

85 mg of N-(2,6-diisopropylphenyl)-8,9-([b]-N,N-bis(9,9-dimethyl-9H-fluoren-2-yl)-1H-indol-6-amine)-3,4-perylenedicarboximide (0.087 mmol) and 3 mg of sodium hydride (0.125 mmol) were introduced into a Schlenk tube and evacuated. 15 mL of anhydrous DMF were added under argon. The solution was stirred at room temperature for 20 minutes. After the addition of 60 mg of bromohexane (0.242 mmol), the solution was stirred for a further 3 h.

The solvent was removed using a Kugelrohr still and the reaction mixture was purified by means of column chromatography on silica gel with dichloromethane.

Yield: 85 mg (92%)

Method B:

In an argon-purged flask, 0.54 g of N-(2,6-diisopropylphenyl)-8,9-([b]-N,N-bis(9,9-dimethyl-9H-fluoren-2-yl)-1H-indol-6-amine)-3,4-perylenedicarboximide (0.56 mmol) was dissolved in 25 mL of dichloromethane, 0.04 g of sodium hydroxide (1.11 mmol) in 10 mL of acetone was added and the mixture was stirred at room temperature for 5 minutes. Finally, 0.18 g of bromohexane (1.11 mmol) was introduced and the mixture was stirred at reflux under argon overnight.

The reaction mixture was extracted by shaking with water/dichloromethane and purified by means of column chromatography on silica gel in dichloromethane.

Yield: blue solid 0.42 g (71%)

e) Synthesis of 8,9-([b]-N,N-bis(9,9-dimethyl-9H-fluoren-2-yl)-1-hexyl-1H-indol-6-amine)-3,4-perylenedicarboxylic anhydride

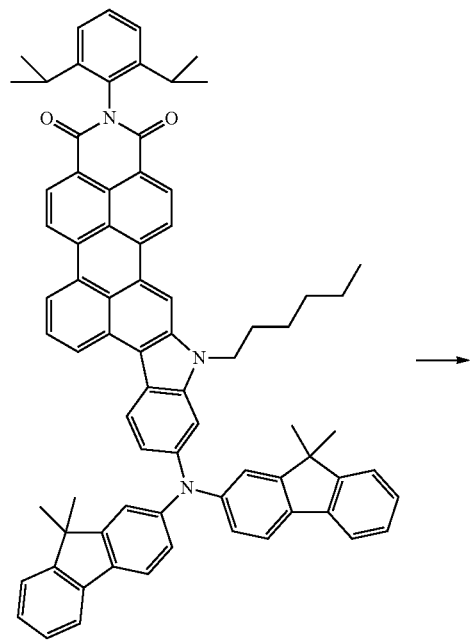

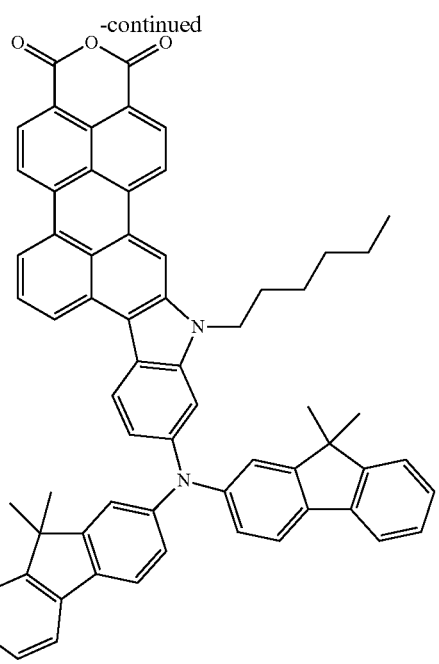

200 mg of N-(2,6-diisopropylphenyl)-8,9-([b]-N,N-bis(9,9-dimethyl-9H-fluoren-2-yl)-1-hexyl-1H-indol-6-amine)-3,4-perylenedicarboximide (0.189 mmol) were dissolved in 15 mL of 2-methyl-2-butanol, 425 mg of potassium hydroxide (7.59 mmol) were added, and the mixture was degassed and boiled under reflux overnight.

After cooling, the reaction solution was added to ice in dilute acetic acid (1:10 acetic acid:water). The precipitate was filtered off, washed with water and dissolved in dichloromethane. A few drops of acetic acid were added to the solution, which was stirred overnight. The resulting anhydride (N-(2,6-diisopropylphenyl)-8,9-([b]-N,N-bis(9,9-dimethyl-9H-fluoren-2-yl)-1-hexyl-1H-indol-6-amine)-3,4-perylenedicarboxylic monoanhydride) was converted further in crude form.

Yield (crude): 160 mg (94%) of blue solid f) Synthesis of the Target Compound

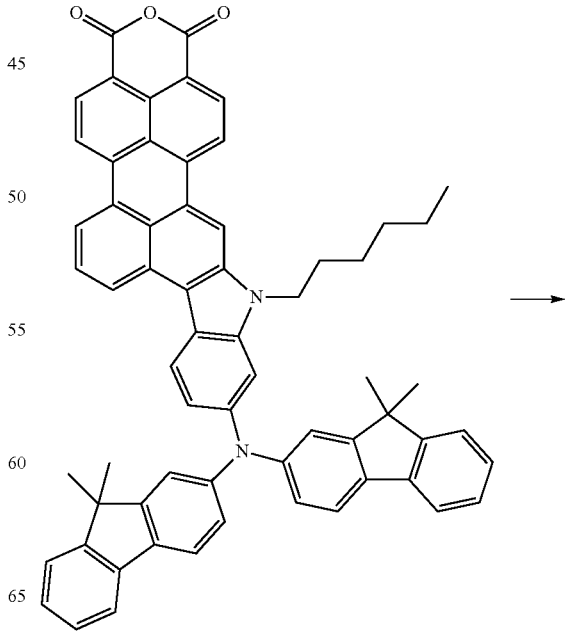

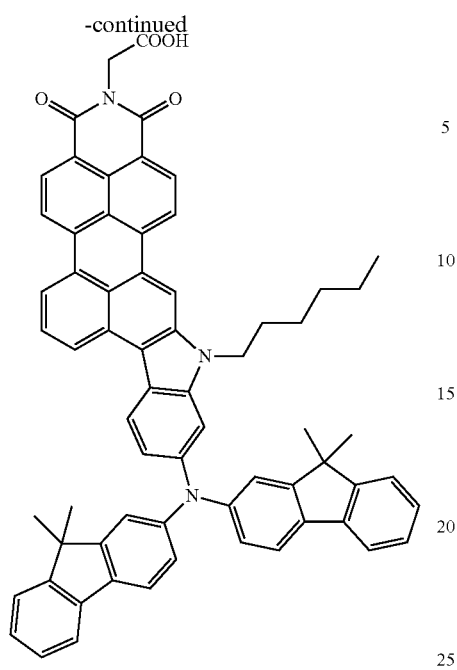

160 mg of the crude anhydride (0.076 mmol) were introduced together with 2 g of glycine (26.8 mmol) and 3 g of imidazole (44.1 mmol) into a Schlenk tube. After degassing, the mixture was stirred at 140° C. under argon overnight.

After cooling, the crude product was dissolved from the flask by dilute hydrochloric acid (1:5 hydrochloric acid:water). The precipitate was filtered off and washed to neutrality, and the crude product was purified by means of column chromatography on silica gel with THF and THF:acetic acid (1:1).

Yield: 100 mg (58%) of blue solid

3.) Synthesis of the Inventive Compound (PS3)

The compound was prepared analogously to the synthesis of compound ID1216 using bis(9,9-dibutylfluoren-2-yl)amine rather than bis(9,9-dimethylfluoren-2-yl)amine.

(PS3)

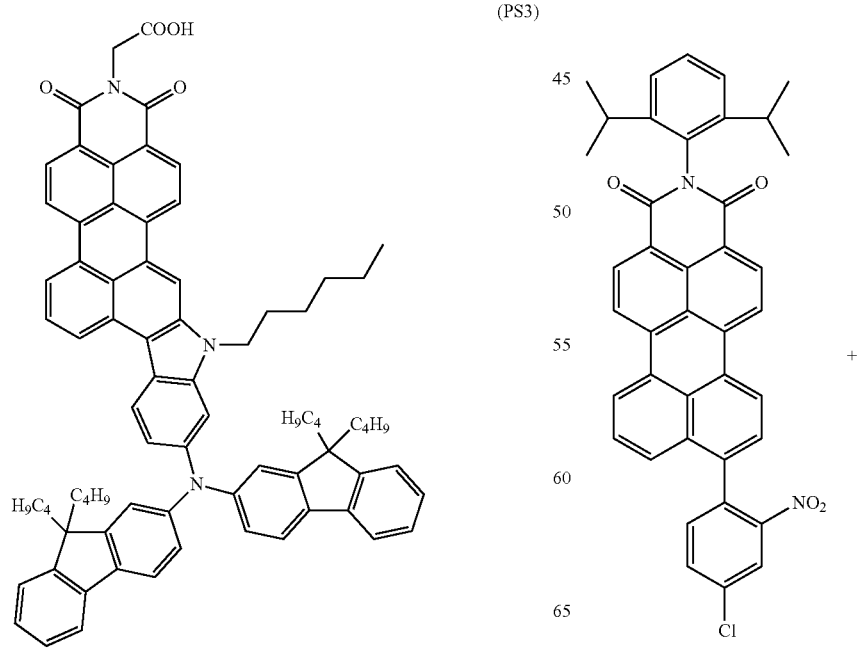

4.) Synthesis of the Inventive Compound (PS4)

(PS4)

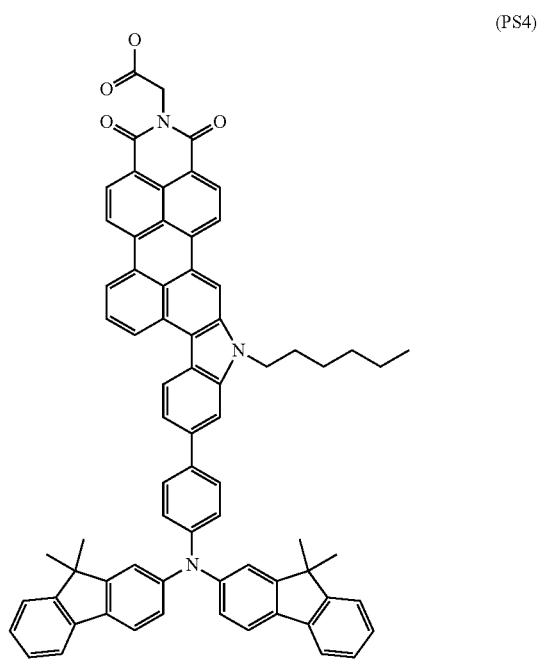 [SMILES: CCCCCCn1c2cc(-c3ccc(N(c4ccc5c(c4)C(C)(C)c4ccccc4-5)c4ccc5c(c4)C(C)(C)c4ccccc4-5)cc3)ccc2c2c3cccc4c5ccc6c7c(ccc(c(cc21)c43)c75)C(=O)N(CC(=O)O)C6=O]

a) Synthesis of N-(2,6-diisopropylphenyl)-9-(4-(bis (9,9-dimethylfluoren-2-yl)-amine)-2-nitrobiphenyl)-3,4-perylenedicarboximide b) Synthesis of N-(2,6-diisopropylphenyl)-8,9-([b]-N,N-bis(9,9-dimethyl-9H-fluoren-2-yl)-1H-indol-6-amine)-4-phenyl-3,4-perylenedicarboximide

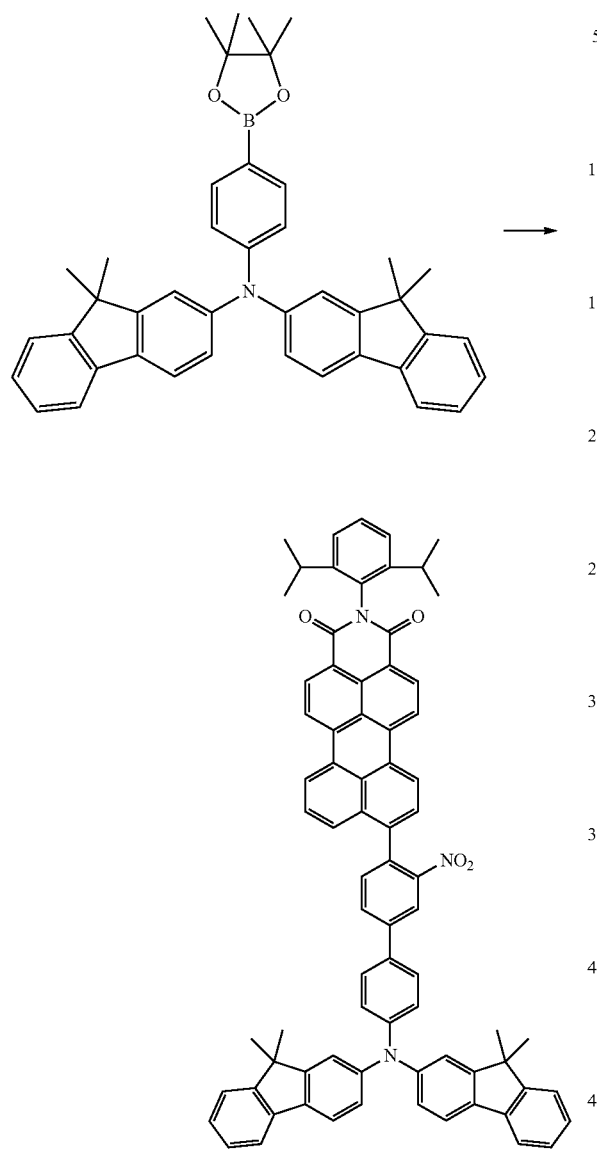

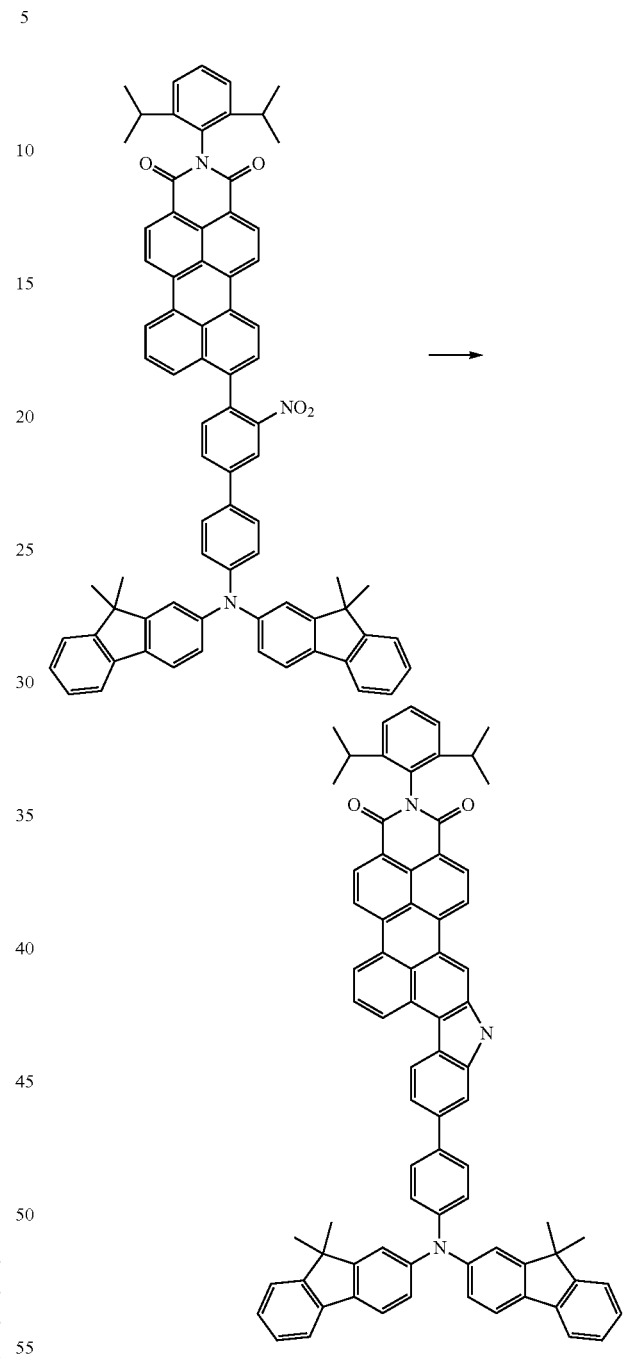

1.5 g of N-(2,6-diisopropylphenyl)-9-(4-chloro-2-nitrobiphenyl)-3,4-perylenedicarboximide (2.4 mmol) were dissolved in 50 mL of dioxane, and 1.4 ml of 5M sodium hydroxide solution (7.1 mmol) were added. After degassing with argon for 30 min, 0.04 g of bis(tri-tert-butylphosphine)palladium(0) (0.08 mmol) and 1.7 g of bis(9,9-dimethyl-9H-fluoren-2-yl)-[4-(4,4,5,5-tetramethyl-[1,3,2]dioxaborolan-2-yl)phenyl]amine (2.8 mmol) were introduced successively. The reaction proceeds at 85° C., generally over a period of 3 to 4 days.

Thereafter, the solvent was drawn off on a rotary evaporator. The purification was effected by column chromatography on silica gel in methylene chloride.

Yield: 1.6 g (64%) of red solid 800 mg of N-(2,6-diisopropylphenyl)-8,9-([b]-N,N-bis(9,9-dimethyl-9H-fluoren-2-yl)-1H-indol-6-amine)-4-phenyl-3,4-perylenedicarboximide (0.74 mmol) were dissolved together with 600 mg of triphenylphosphine (2.2 mmol) in 15 ml of o-dichlorobenzene and stirred at room temperature for 15 min. This was followed by the reaction in a microwave at 182° C. for 8 h.

The blue reaction mixture formed was precipitated in petroleum ether, stirred at 50° C. for 3 h and filtered with suction through a D4 glass frit. The mother liquor has a strong red color. The blue filter residue was washed with petroleum ether until the filtrate was colorless.

No further purification was necessary.

Yield: 1.5 g (97%) of blue solid c) Synthesis of N-(2,6-diisopropylphenyl)-8,9-([b]-N,N-bis(9,9-dimethyl-9H-fluoren-2-yl)-1-hexyl-1H-indol-6-amine)-4-phenyl-3,4-perylenedicarboximide

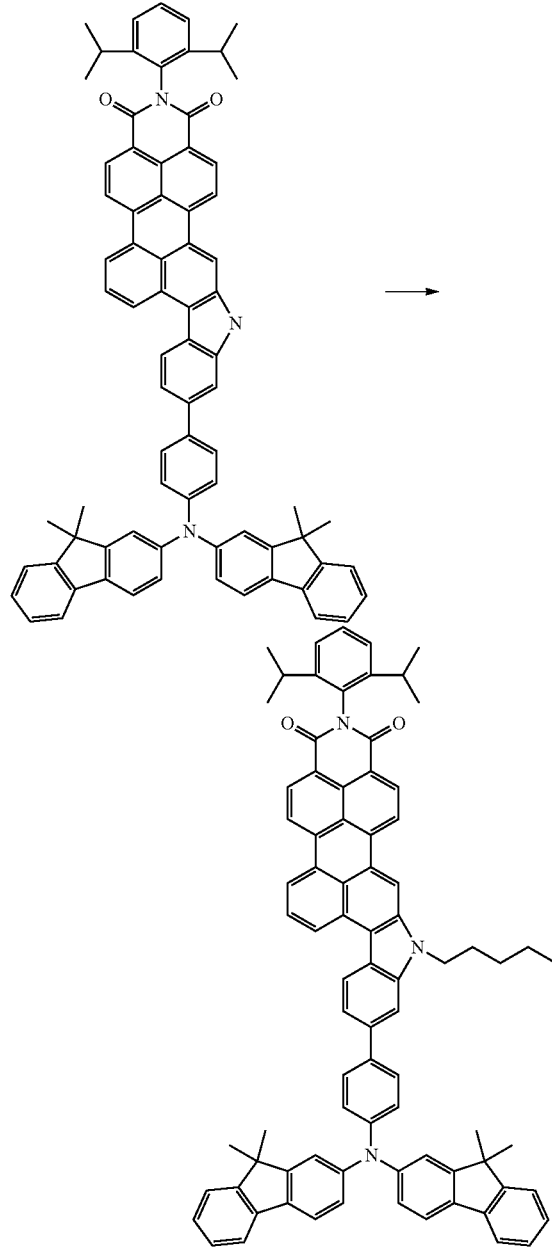

1.5 g of N-(2,6-diisopropylphenyl)-8,9-([b]-N,N-bis(9,9-dimethyl-9H-fluoren-2-yl)-1H-indol-6-amine)-4-phenyl-3,4-perylenedicarboximide (1.4 mmol) were dissolved in 80 mL of dichloromethane, and 0.11 g of sodium hydroxide (2.9 mmol) in 30 mL of acetone was added. After stirring at room temperature for 5 min, 0.71 g of bromohexane (4.3 mmol) was introduced. The mixture was kept at reflux for 2 days and then extracted by shaking with water/dichloromethane. The organic phase was purified by column chromatography on silica gel in dichloromethane.

Yield: 0.64 g (59%) of blue solid d) Synthesis of 8,9-([b]-N,N-bis(9,9-dimethyl-9H-fluoren-2-yl)-1-hexyl-1H-indol-6-amine)-4-phenyl-3,4-perylenedicarboxylic anhydride

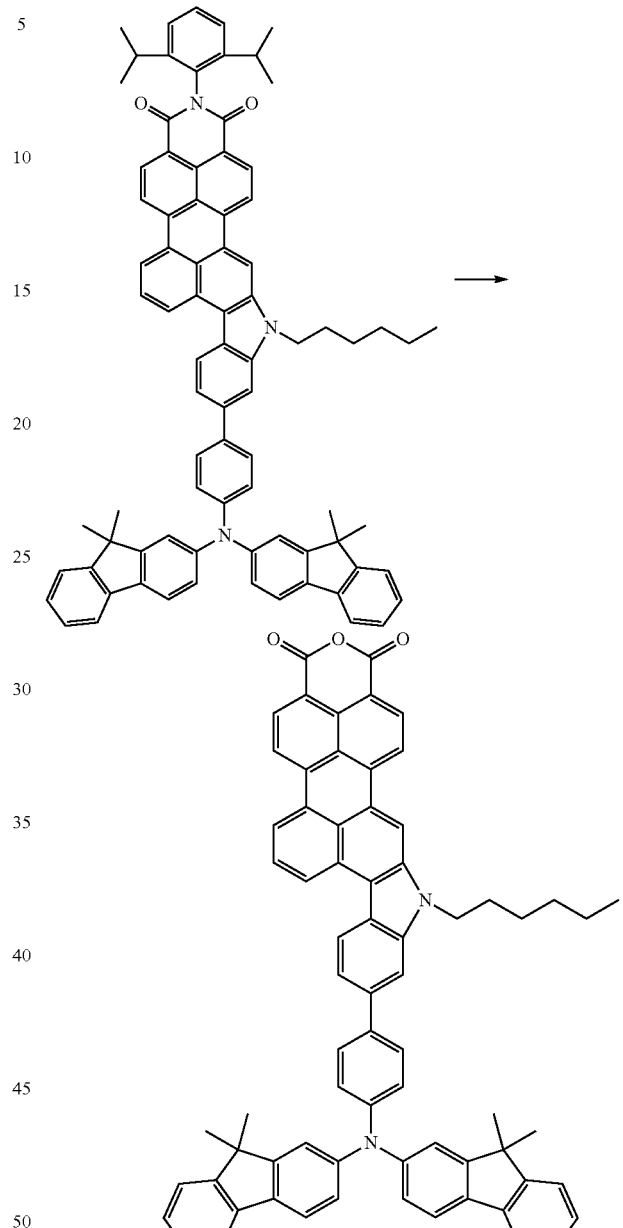

0.95 g of N-carboxymethyl-(2,6-diisopropylphenyl)-8,9-([b]-N,N-bis(9,9-dimethyl-9H-fluoren-2-yl)-1-hexyl-1H-indol-6-amine)-4-phenyl-3,4-perylenedicarboximide (0.84 mmol) was dissolved in 60 ml of 2-methyl-2-butanol, and 1.9 g of KOH (34 mmol) were added. The reaction proceeded under gentle reflux for 2 days.

After cooling to room temperature, the mixture was precipitated in ice-water with acetic acid and stirred for 1 h. The red precipitate formed was filtered off with suction and washed briefly with water. Thereafter, the presscake was dissolved in dichloromethane and the remaining water was removed in a separating funnel. The organic phase was acidified again with acetic acid and stirred at room temperature overnight.

After concentration on a rotary evaporator, the red-violet residue was stirred in methanol for extractive purification, filtered with suction through a glass frit and washed briefly with methanol. The filtrate was pale red in color.

Yield 0.58 g (70%) of red solid e) Synthesis of the Target Compound

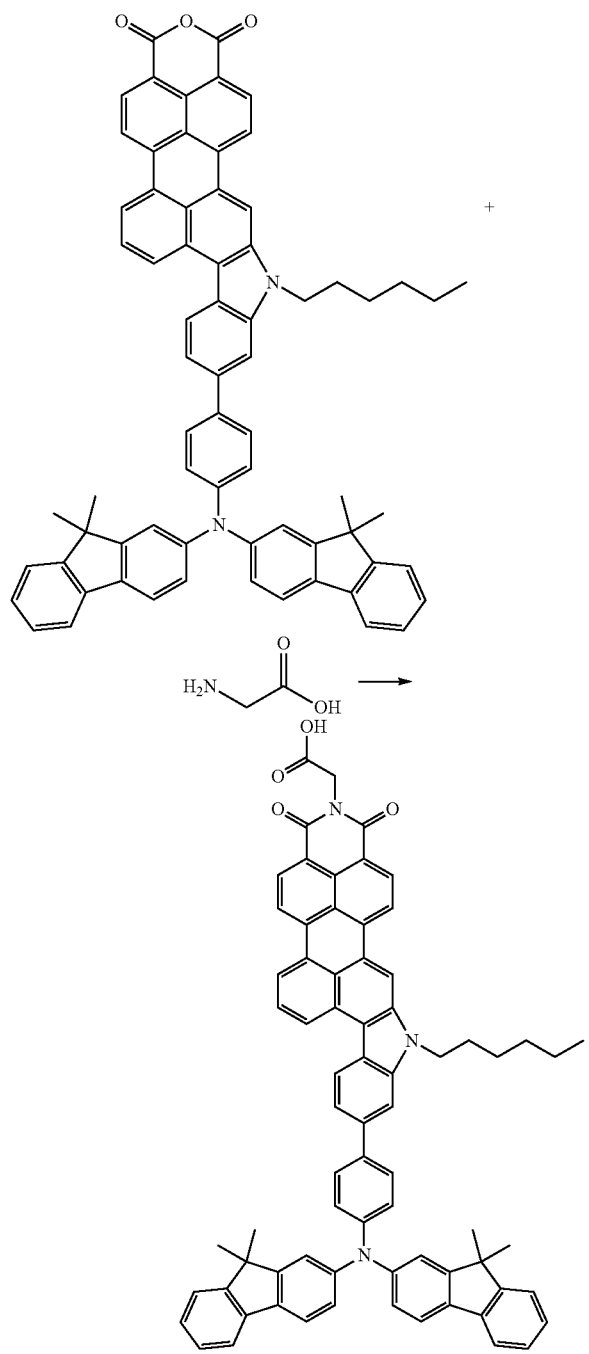

750 mg of 8,9-([b]-N,N-bis(9,9-dimethyl-9H-fluoren-2-yl)-1-hexyl-1H-indol-6-amine)-4-phenyl-3,4-perylenedicarboxylic anhydride (0.77 mmol) were weighed into a Schlenk tube together with 5 g of glycine (67 mmol) and 10 g of imidazole (147 mmol). The flask was closed with a septum and shaken gently in order to roughly mix the powders. Subsequently, reduced pressure was applied for 15 min and, finally, the mixture was heated to 140° C. under argon. The flask was darkened with aluminum foil in order to prevent sublimation at the flask wall.

After 20 h at 140° C., the melt was cooled to 50° C. and precipitated in 500 mL of dilute hydrochloric acid. The further stirring time at 60° C. was 2 h. The precipitate formed was filtered off with suction using a D4 glass frit and washed with warm water until the filtrate was no longer yellow but clear.

The product was purified by column chromatography on silica gel. This commenced with pure dichloromethane+2% acetic acid, with elution here only of the impurities. On addition of 1-5% methanol, the product also began to elute.

Yield: 75 mg (10%) of violet solid

5.) Synthesis of the Inventive Compound (PS5)

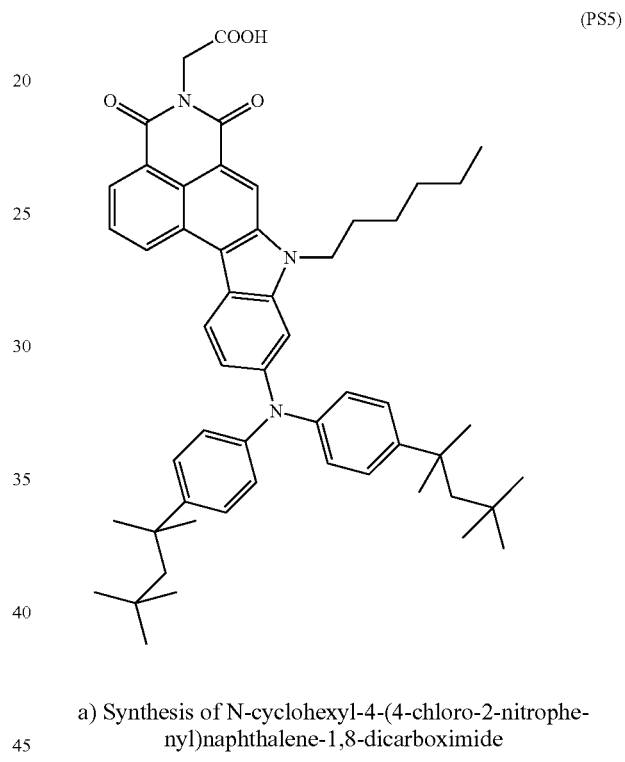

a) Synthesis of N-cyclohexyl-4-(4-chloro-2-nitrophenyl)naphthalene-1,8-dicarboximide

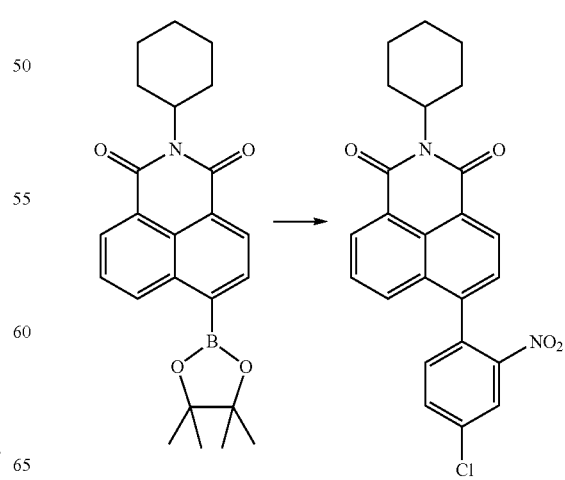

In a Schlenk tube, 2 g of N-cyclohexyl-4-(4,4,5,5-tetramethyl-1,3,2-dioxaborolan-2-yl)-naphthalene-1,8-dicarboximide (4.93 mmol), 1.75 g of 1-bromo-4-chloro-2-nitrobenzene (7.40 mmol) were dissolved in 80 mL of toluene, 1.6 g of potassium carbonate (11.6 mmol) in 8 mL of water and 0.8 mL of ethanol are added, and the mixture was thoroughly degassed. After addition of 800 mg of tetrakis(triphenylphosphine)palladium(0) (0.717 mmol), the mixture was degassed again and stirred at 80° C. under argon for 2 days.

The reaction solution was cooled to room temperature and extracted with water and dichloromethane. The reaction mixture was separated by column chromatography on silica gel by means of dichloromethane:petroleum ether (1:1).

Yield: 700 mg (32) of pale yellow solid b) Synthesis of N-cyclohexyl-4-(4-di(p-tert-octylphenyl)amino-2-nitrophenyl)naphthalene-1,8-dicarboximide

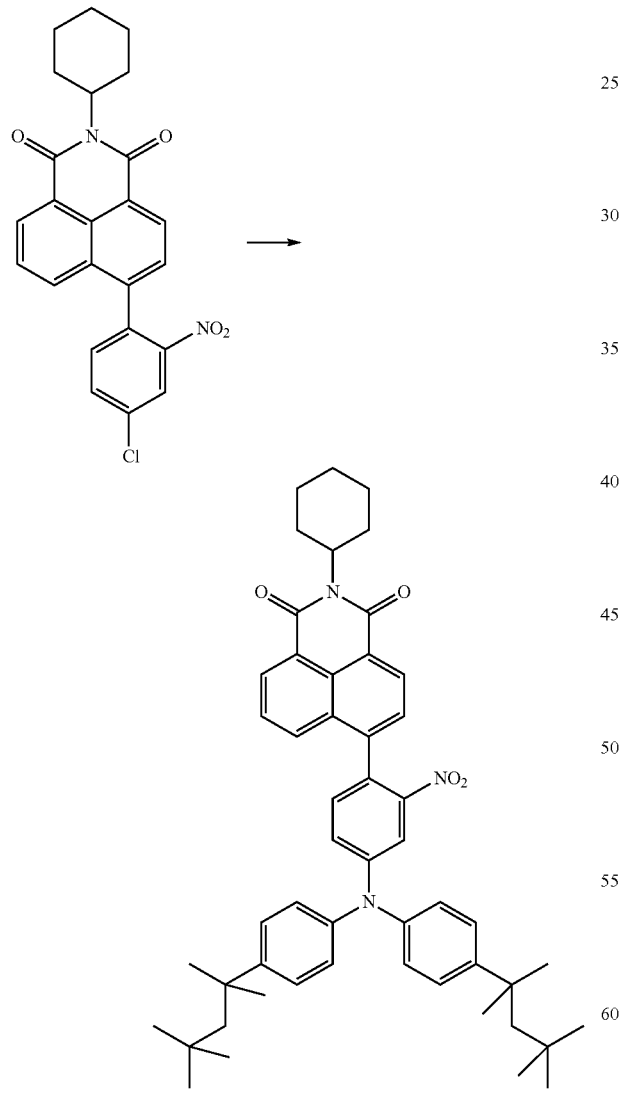

600 mg of N-cyclohexyl-4-(4-chloro-2-nitrophenyl)naphthalene-1,8-dicarboximide (1.38 mmol), 815 mg of bis(9,9-dimethylfluoren-2-yl)amine (2.07 mmol), 900 mg of cesium carbonate (2.76 mmol), 125 mg of tris(dibenzylideneacetone)dipalladium(0) (0.136 mmol) and 170 mg of 2,2"-bis(diphenylphosphino)-1,1"-binaphthyl (0.273 mmol) were dissolved in 30 mL of dry toluene under argon and stirred at 100° C. under argon for 16 h.

The crude mixture was purified by means of column chromatography on silica gel with dichloromethane:petroleum ether (1:1).

Yield: 640 mg of yellow solid (64%)

c) Synthesis of N-cyclohexyl-3,4-([b]-N,N-bis(p-tert-octylphenyl)-1-hexyl-1H-indol-6-amine)-1,8-naphthalenedicarboximide

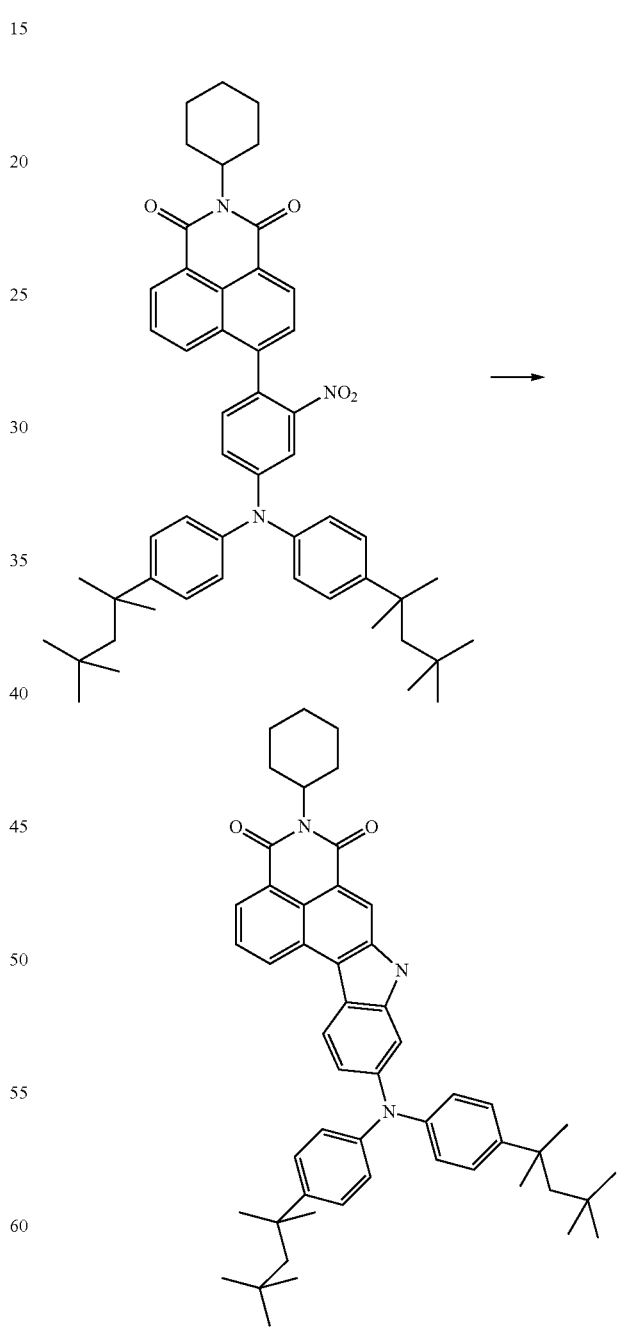

550 mg of N-cyclohexyl-4-(4-di(p-tert-octylphenyl)amino-2-nitrophenyl)naphthalene-1,8-dicarboximide (0.694 mmol) and 545 mg of triphenylphosphine (2.08 mmol) were dissolved in 10 mL of o-dichlorobenzene and stirred in a microwave at 182° C. and 300 W over the course of 4 h. The solvent was removed by means of a Kugelrohr still and isolated by means of column chromatography on silica gel with dichloromethane.

Yield (crude): 430 mg (82%) of orange solid d) Synthesis of N-cyclohexyl-3,4-([b]-N,N-bis(p-tert-octylphenyl)-1-hexyl-1H-indol-6-amine)-1,8-naphthalenedicarboximide

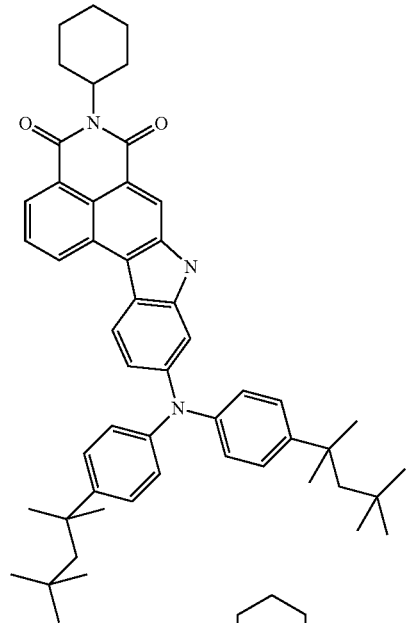

350 mg of N-cyclohexyl-3,4-([b]-N,N-bis(p-tert-octylphenyl)-1H-indol-6-amine)-1,8-naphthalenedicarboximide (0.460 mmol) and 14 mg of sodium hydride (0.583 mmol) were introduced into a Schlenk tube, which was evacuated. 15 mL of anhydrous DMF were added under argon. The solution was stirred at room temperature for 30 minutes. After the addition of 230 mg of bromohexane (1.39 mmol), the solution was stirred for a further 3 h.

The reaction was quenched with water, extracted with dichloromethane and water/hydrochloric acid (3:1) and dried over magnesium sulfate. The orange crude product was purified by means of column chromatography on silica gel with dichloromethane.

Yield: 270 mg (71%) of orange solid e) Synthesis of 3,4-([b]-N,N-bis(p-tert-octylphenyl)-1-hexyl-1H-indol-6-amine)-1,8-naphthalenedicarboxylic anhydride (PS6)

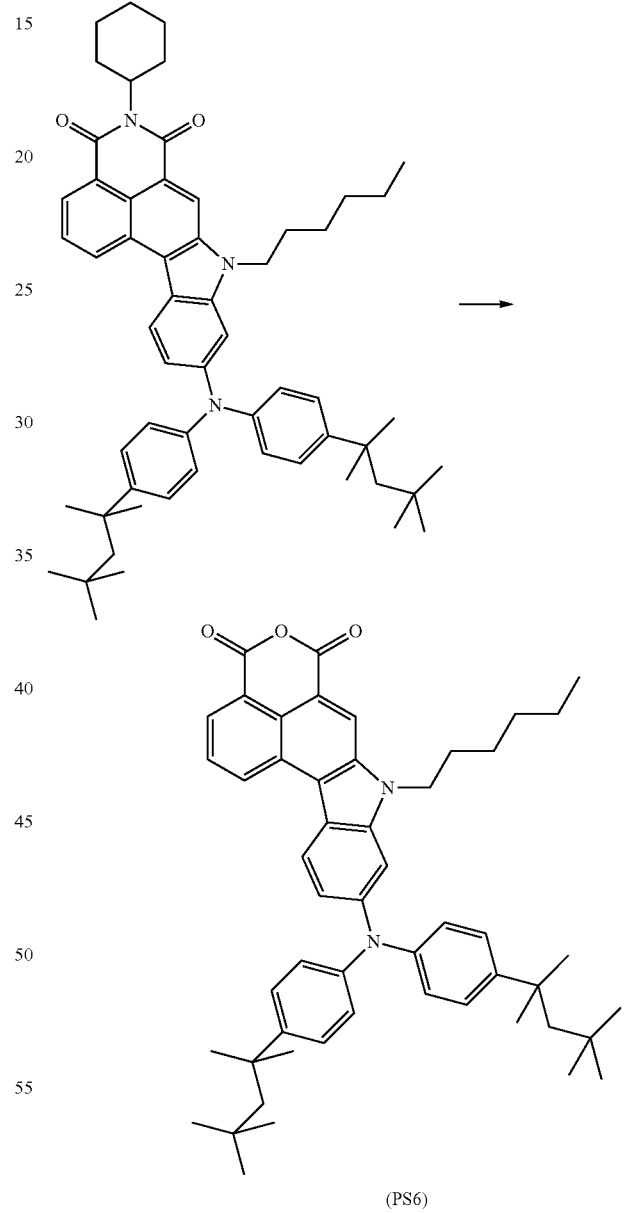

170 mg of N-cyclohexyl-3,4-([b]-N,N-bis(p-tert-octylphenyl)-1-hexyl-1H-indol-6-amine)-1,8-naphthalenedicarboximide (0.201 mmol) were dissolved in 10 mL of 2-methyl-2-butanol, 450 mg of potassium hydroxide (8.04 mmol) were added, and the mixture was degassed and boiled under reflux overnight.

After cooling, the reaction solution was added to ice in dilute acetic acid (1:10 acetic acid:water). The precipitate was filtered off, washed with water and dissolved in dichloromethane. A few drops of acetic acid were added to the solution, which was stirred overnight. The majority of the anhydride formed (N-cyclohexyl-3,4-([b]-N,N-bis(p-tert-octylphenyl)-1-hexyl-1H-indol-6-amine)-1,8-naphthalenedicarboxylic monoanhydride) was converted further in crude form.

A portion (60 mg) of the product was purified by column chromatography (silica gel, 4:1 toluene:DCM) and used as the inventive dye PS6 for the construction of the OPV cell described hereinafter.

Yield (crude): 145 mg (95%) of red solid e) Synthesis of the Target Compound

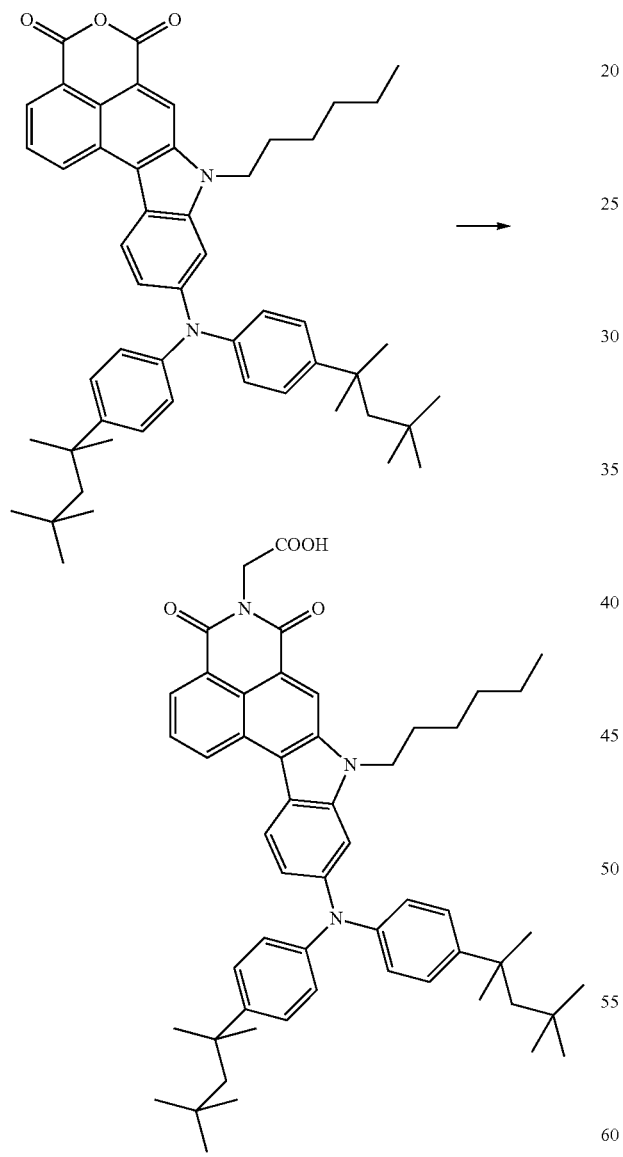

80 mg of the crude anhydride (0.104 mmol) were introduced together with 1 g of glycine (23.4 mmol) and 2 g of imidazole (29.4 mmol) into a Schlenk tube. After degassing, the mixture was stirred at 140° C. under argon overnight.

After cooling, the crude product was dissolved from the flask by means of dilute hydrochloric acid (1:5 hydrochloric acid:water). The precipitate was filtered off and washed to neutrality. The crude product was purified by means of column chromatography on silica gel with dichloromethane, THF and dichloromethane:acetic acid (1:1).

Yield: 75 mg (87%) of orange solid

6. Synthesis of the Inventive Compound (PS7)

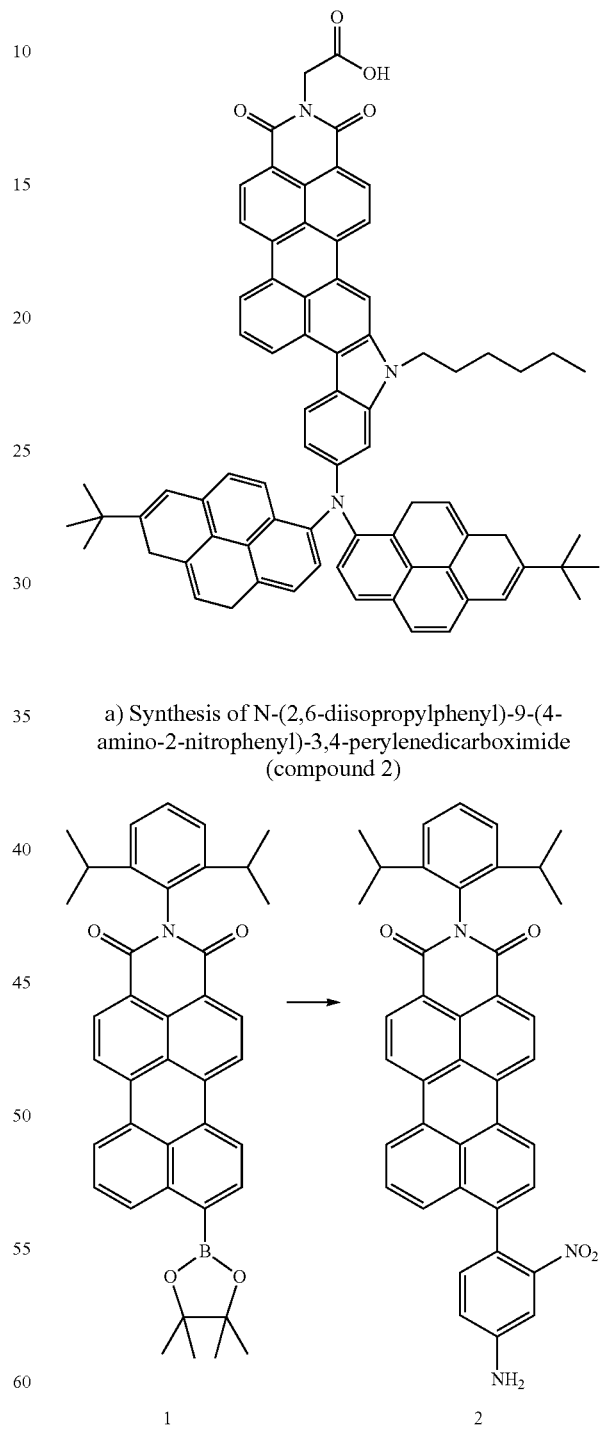

a) Synthesis of N-(2,6-diisopropylphenyl)-9-(4-amino-2-nitrophenyl)-3,4-perylenedicarboximide (compound 2)

In a three-neck flask, 1 g of N-(2,6-diisopropylphenyl)-9-(4,4,5,5-tetramethyl-1,3,2-dioxaborolan-2-yl)-3,4-perylenedicarboximide (1.6 mmol; compound 1) and 1.4 g of 1-bromo-4-amino-2-nitrobenzene (6.6 mmol) were dissolved in 50 mL of toluene and 1.8 g of potassium carbonate (23 mmol) in 10 mL water and 5 mL ethanol were added. After the reaction solution had been purged with argon, 0.6 g of tetrakis (triphenylphosphine)palladium(0) (0.49 mmol) were added and the mixture was stirred at 85° C. for 20 h.

The reaction solution was cooled to room temperature and extracted with water and dichloromethane. The reaction mixture was separated by column chromatography on silica gel by means of dichloromethane.

Yield: 0.7 g (69%) of red solid b) Synthesis of Compound 3

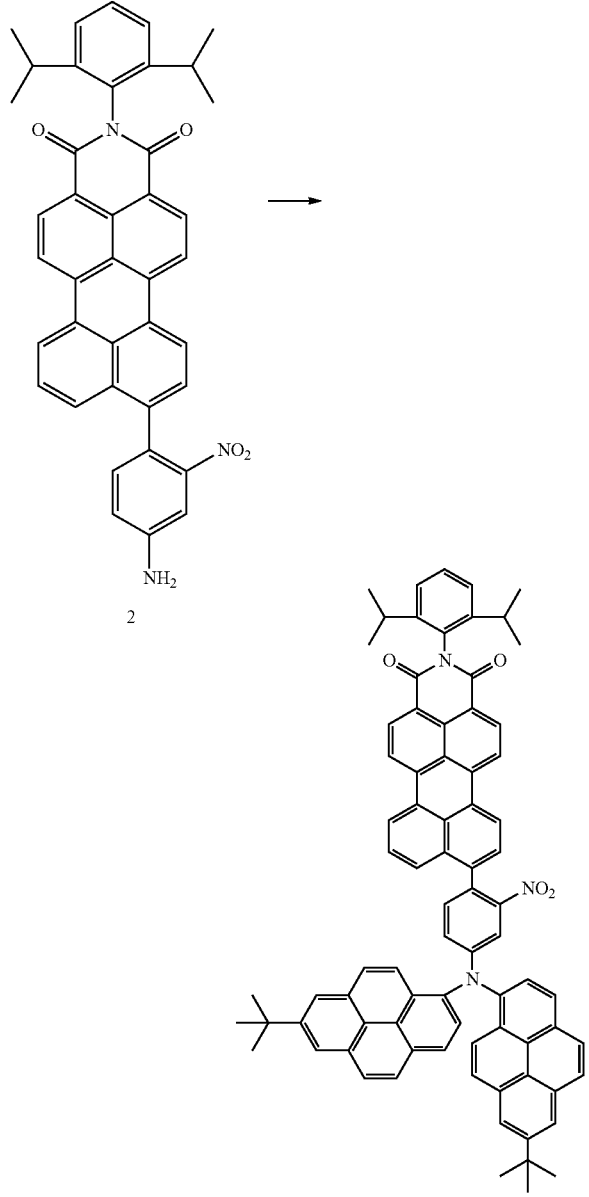

weight-% in toluene; 0.11 mmol) and 0.16 g sodium tert-butylate (1.6 mmol) were added and the mixture was stirred at 80° C. for 20 h.

The reaction solution was cooled to room temperature, the solvent removed by means of a rotary evaporator and the product isolated by means of column chromatography on silica gel with dichloromethane/toluene 4:1.

Yield: 220 mg (24%) of violet solid c) Synthesis of Compound 4

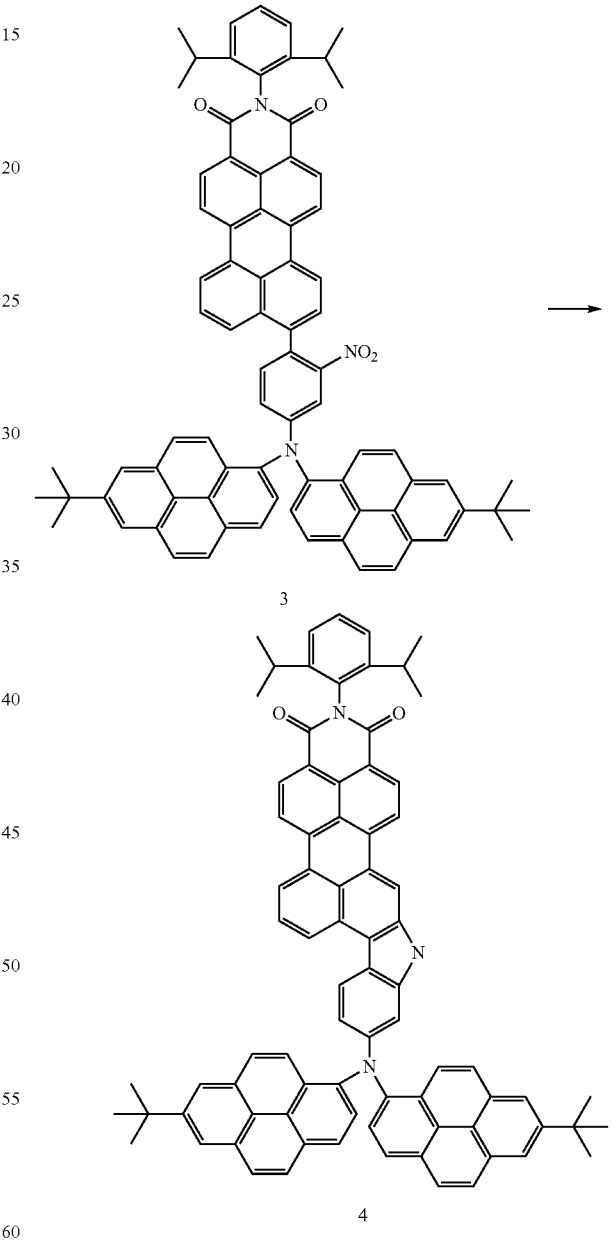

In a two-neck flask, 0.5 g of N-(2,6-diisopropylphenyl)-9-(4-amino-2-nitrophenyl)-3,4-perylenedicarboximide (0.8 mmol; compound 2) and 0.82 g of 7-bromo-2-tert-butylpyrene (2.4 mmol) were dissolved in 25 mL of toluene. Consecutively, 0.06 g of tris(dibenzylidenacetone)dipalladium(0) (0.06 mmol), 0.2 g tri-(tert-butyl)phospine (10

220 mg of compound 3 (0.19 mmol) and 118 mg triphenylphosphine (0.58 mmol) were dissolved in 2 mL of o-dichlorobenzene and stirred in a microwave at 182° C. for 12 h.

Using toluene the reaction mixture was transferred in a round-bottomed flask, concentrated by means of a rotary evaporator to dryness and the purification was effected by column chromatography on silica gel with dichloromethane/toluene 4:1.

Yield: 140 mg (65%) of a green solid d) Synthesis of Compound 5

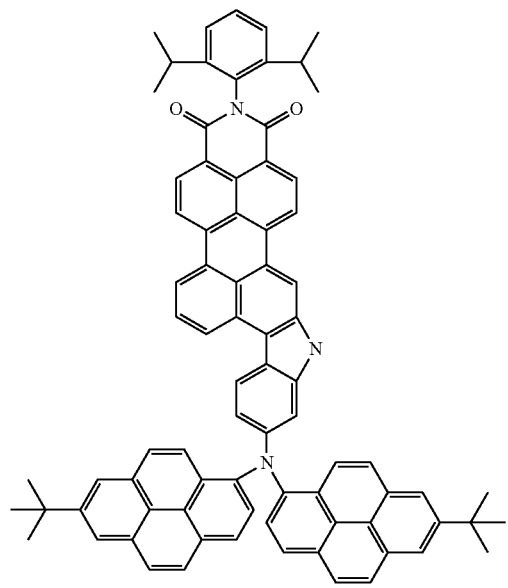

4

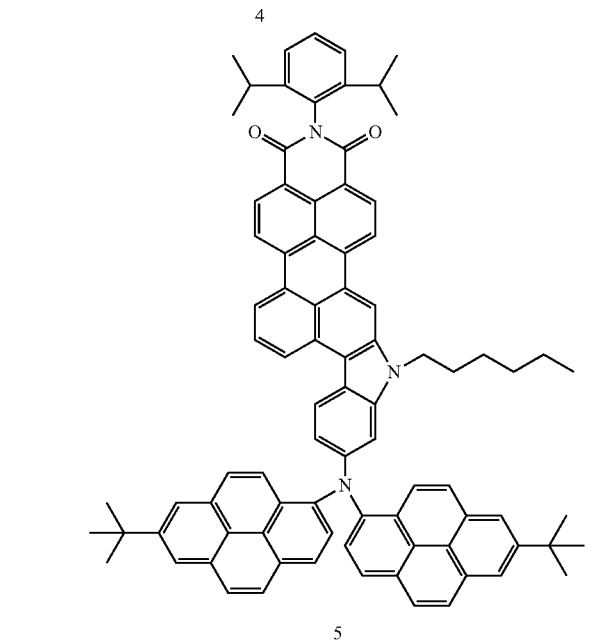

5

140 mg of compound 4 (0.13 mmol) and 8 mg of sodium hydride (60 weight-% in mineral oil; 0.19 mmol) were introduced into a Schlenk tube and the latter evacuated. Under an argon atmosphere 15 mL of dry dimethyl formamide war added. The mixture was stirred at room temperature for 20 min. 63 g (0.38 mmol) of bromohexane were added and the solution was stirred for a further 4 h.

The reaction solution was extracted with water and dichloromethane and the product isolated by means of column chromatography on silica gel with dichloromethane/toluene 4:1.

Yield: 100 mg (67%) of a green solid e) Synthesis of Compound 6

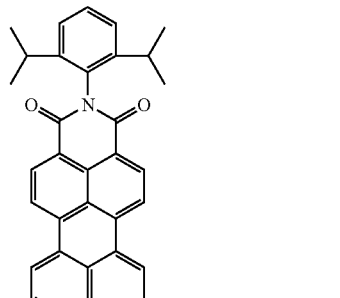

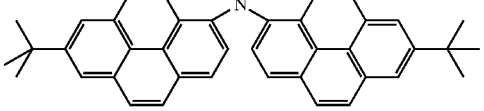

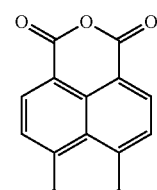

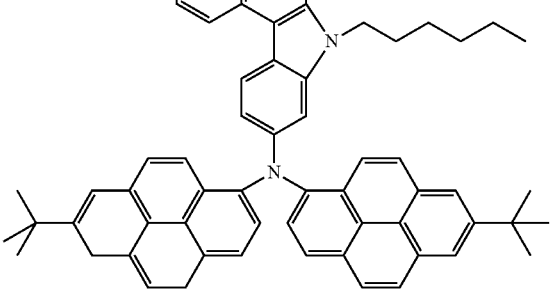

6

100 mg of compound 5 (0.08 mmol) were dissolved in 20 mL of 2-methyl-2-butanol, 189 mg of potassium hydroxide (3.4 mmol) added and the mixture heated under reflux over night.

After cooling to room temperature, the mixture was poured on crushed ice in diluted acetic acid (1:10 acetic acid:water). The precipitate formed was filtered off, washed with water and dissolved in dichloromethane. Thereafter, the solution was acidified with a few mL of acetic acid and stirred at room temperature over night. The solvent was removed by means of a rotary evaporator, the resulting residue stirred with methanol, filtered off and then dried.

Yield: 65 mg (75%) of green solid f) Synthesis of Target Compound PS7

7. Synthesis of the Inventive Compound (PS8)

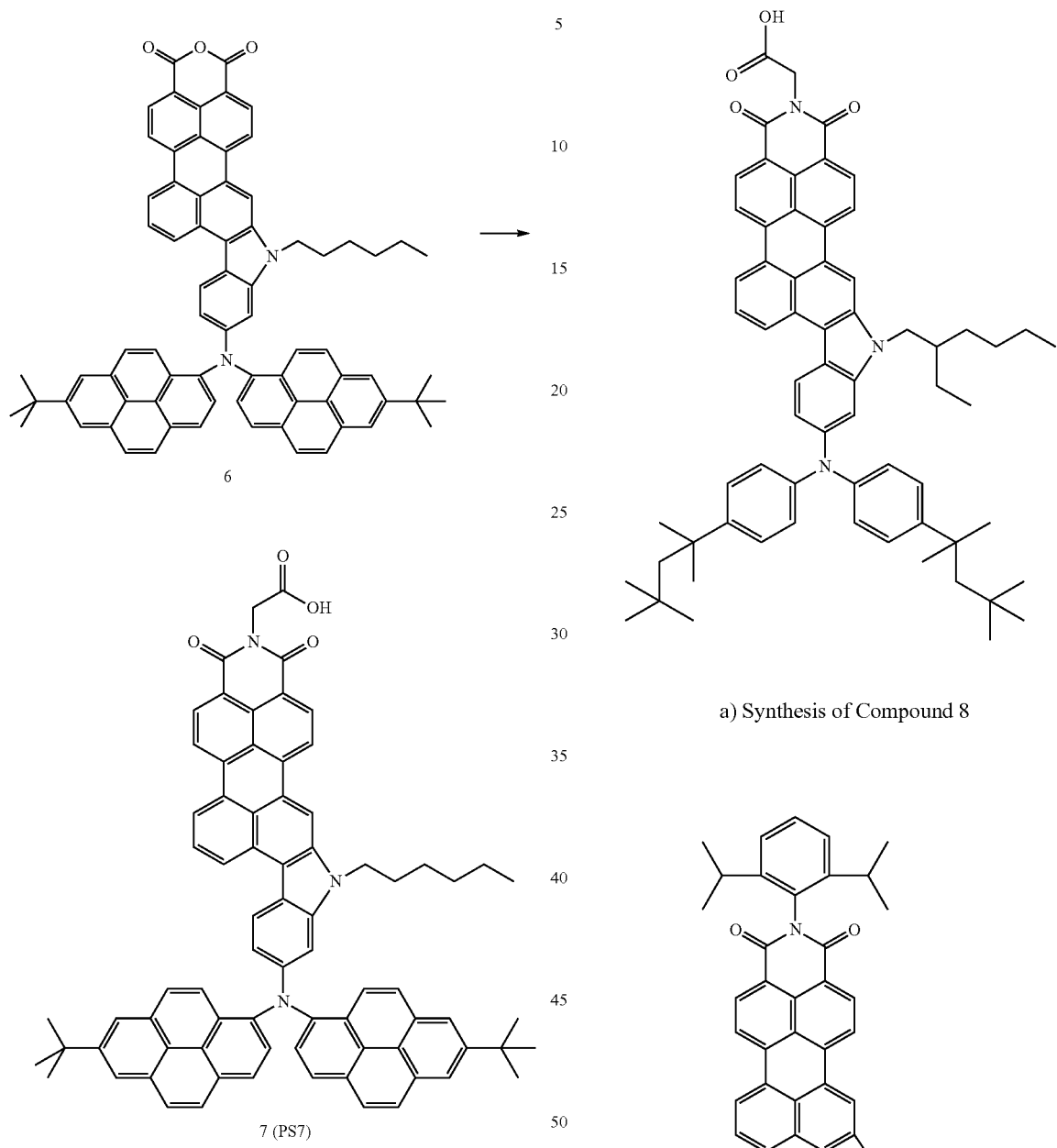

a) Synthesis of Compound 8

65 mg of compound 6 (0.06 mmol), 1 g of glycine (0.013 mmol) and 2 g of imidazole (0.029 mmol) were introduced into a Schlenk tube. After degassing the reaction mixture was stirred under an argon atmosphere at 140° C. over night.

The reaction mixture was cooled to room temperature, the reaction product rinsed out of the Schlenk tube with 2 M hydrochloric acid and the precipitate filtered off and washed to neutrality. The crude product was cleaned by means of column chromatography on silica gel with dichloromethane/ ethanol 9:1 with addition of 2% of triethylamine.

Yield: 50 mg (75%) of green solid

Compound 8 was prepared analogously to steps 2.) b), 2.) c) and 2.) d) of the synthesis of compound PS2 using 4-(1,1, 3,3-tetramethylbutyl)-N-[4-(1,1,3,3-tetramethylbutyl)phenyl]aniline and 3-(bromomethyl)heptane rather than bis(9,9-dimethylfluoren-2-yl)amine (step 2.) b)) and bromohexane (step 2.) d)), respectively.

b) Synthesis of Compound 9

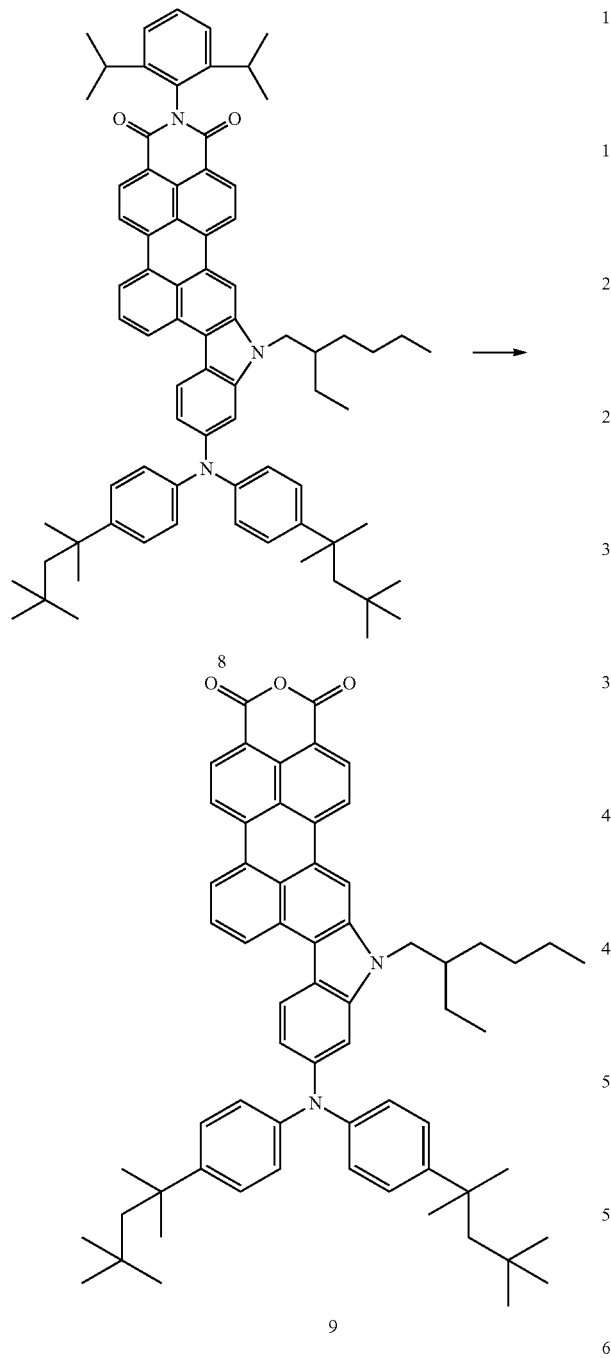

8

9

70 mg of compound 8 (0.065 mmol) were dissolved in 20 mL of 2-methyl-2-butanol, 146 mg potassium hydroxide (2.6 mmol) added and the reaction mixture was stirred under reflux over night.

After cooling, the reaction solution was added to ice in dilute acetic acid (1:10 acetic acid:water). The precipitate was filtered off, washed with water and dissolved in dichloromethane. A few drops of acetic acid were added to the solution, which was stirred at room temperature overnight. The solvent was removed by means of a rotary evaporator, the resulting residue stirred with methanol, filtered off and dried.

Yield: 30 mg (51%) of blue solid c) Synthesis of target compound ID1554

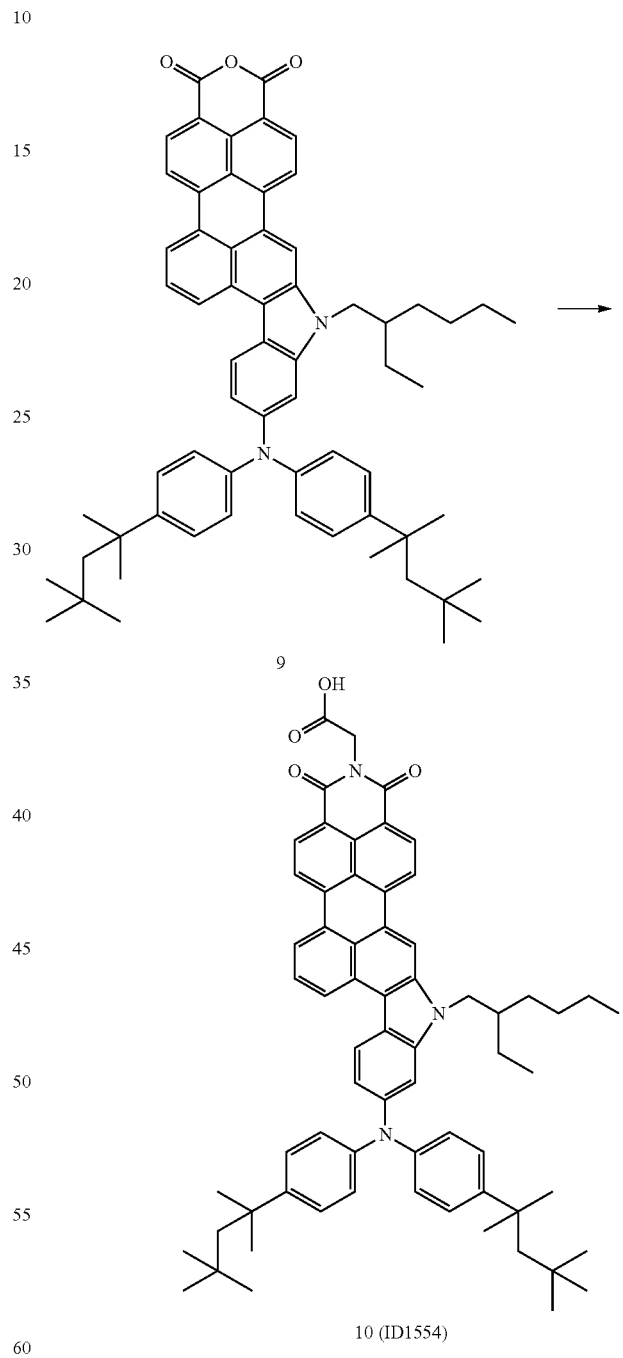

9

10 (ID1554)

In a three-neck flask, 30 mg of compound 9 (0.03 mmol) were given to 15 mL of N-methyl-2-pyrrolidone (NMP), 25 mg of glycine (0.3 mmol) and 6 mg zinc acetate (0.03 mmol) added and the reaction mixture was stirred at 130° C. over night.

Yield: 26 mg (81%) of blue solid

Use Examples:

For further substance designations used, the corresponding chemical compounds are listed hereinafter:

ID 423

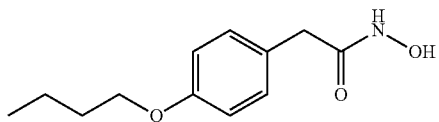

(commercially available, for example, from Sigma-Aldrich)

ID 662

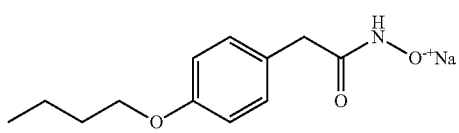

The sodium salt was obtained by reaction of the commercially available hydroxamic acid with sodium hydroxide solution.

ID 750

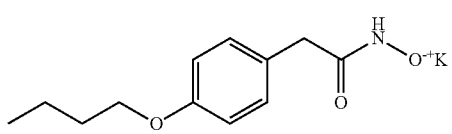

The potassium salt was obtained by reaction of the commercially available hydroxamic acid with potassium hydroxide solution.

ID 758:

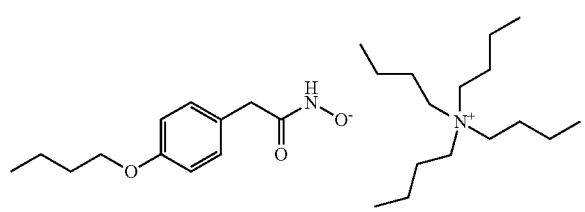 [SMILES: CCCCOc1ccc(CC(=O)N[O-])cc1 ; CCCC[N+](CCCC)(CCCC)CCCC]

The tetrabutylammonium salt was obtained by reaction of the commercially available hydroxamic acid with tetrabutylammonium hydroxide.

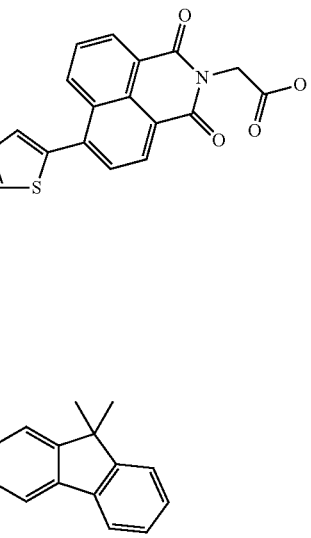

The compound and preparation thereof are described in the publication WO 2012/085803 A1 in example 2 on page 12.

Construction of OPV Cell:

The base material used was glass plates which had been coated with fluorine-doped tin oxide (FTO) and had dimensions of 25 mm×15 mm×3 mm (Nippon Sheet Glass), which had been treated successively with glass cleaner (RBS 35), demineralized water and acetone, in each case for 5 min in an ultrasound bath, then boiled in isopropanol for 10 minutes and dried in a nitrogen stream.

Step A)

To produce the solid $TiO_2$ barrier layer, a spray pyrolysis process as described in Peng et al., Coord. Chem. Rev. 248 (2004), 1479 was used. By means of a screenprinting process, a nanoporous $TiO_2$ layer of thickness 1.8 μm was applied to the solid $TiO_2$ barrier layer. The base material used for this layer was the $TiO_2$ paste Dyesol (from Dyesol), which consisted of $TiO_2$ particles with a diameter of approx. 25 nm, which were dispersed in a terpineol/ethylcellulose dispersion. After the printing process, the paste was dried at 80° C. for 5 minutes. This was followed by sintering at 450° C. for 30 minutes.

Step B)

After removal from the drying cabinet, the sample was cooled to 80° C., immersed into a $5\times10^{-4}$ molar ethanol solution of the hydroxamic acid salt ID 662 for 16 h, washed briefly with ethanol and then placed into a $5\times10^{-4}$ molar solution of the inventive dye in dichloromethane for 1 h. The sample removed from the solution was subsequently rinsed with the appropriate solvent and dried in a nitrogen stream.

Step C)

Next, a p-conductor solution was spun on. For this purpose, a solution was prepared, consisting of: 0.163 M spiro-OMeTAD (Lumtec, SHT-263), 20 mM $LiN(SO_2CF_3)_2$ (Aldrich) and 2.5 percent by weight of $V_2O_5$ based on spiro-OMeTAD. 125 μl of this solution were applied to the sample and allowed to act for 60 s. Thereafter, the excess solution was spun off at 2000 rpm for 30 s.

The metal back electrode was applied by thermal metal vaporization under reduced pressure. For this purpose, the sample was provided with a mask, in order to apply 8 separate back electrodes with dimensions of 0.13 cm² to the active region by vapor deposition. The metal used was Ag, which was vaporized at a rate of 3.0-3.5 nm/s at a pressure of approx. 5*10$^{-5}$ mbar, so as to result in a layer thickness of 200 nm.

The quantum efficiency (IPCE=Incident Photon-to-current Conversion Efficiency) was then measured with a 75 watt xenon arc lamp (LOT-Oriel), a ⅛ m monochromator (SpectraPro-2150i; Acton Research Corporation).

The current/voltage characteristics were measured with the aid of a 450 watt xenon arc lamp (LOT-Oriel) at an illumination intensity of 100 mW/cm$^2$ AM 1.5 and a Keithley 2400 multimeter.

Tables 1 to 7 show the following parameters: $I_{SC}$—short circuit current, $V_{OC}$—open circuit voltage; FF—fill factor; ETA—efficiency.

TABLE 1

Results for PS2

| Additive | Isc[mA/cm$^2$] | Voc[mV] | FF[%] | ETA[%] |
|---|---|---|---|---|
| ID423 | −13.3 | 460 | 41 | 2.5 |
| ID758 | −9.3 | 640 | 52 | 3.0 |
| ID750 | −8.1 | 740 | 64 | 3.8 |
| ID662 | −7.7 | 780 | 61 | 3.5 |
| ID758/ID741 | −11.8 | 660 | 41 | 4.0 |

TABLE 2

Results for PS4

| Additive | Isc[mA/cm$^2$] | Voc[mV] | FF[%] | ETA[%] |
|---|---|---|---|---|
| ID423 | −2.83 | 440 | 48 | 0.6 |
| ID758 | −9.14 | 680 | 57 | 3.6 |
| ID662 | −10.41 | 700 | 48 | 3.5 |
| ID750 | −10.33 | 680 | 50 | 3.5 |

TABLE 3

Results for PS1

| Additive | Isc[mA/cm$^2$] | Voc[mV] | FF[%] | ETA[%] |
|---|---|---|---|---|
| ID423 | −6.19 | 480 | 60 | 1.8 |
| ID662 | −4.4 | 720 | 71 | 2.2 |

TABLE 4

Results for PS5

| Additive | Isc[mA/cm$^2$] | Voc[mV] | FF[%] | ETA[%] |
|---|---|---|---|---|
| ID662 | −5.16 | 980 | 64 | 3.2 |

TABLE 5

Results for PS3

| Additive | Isc[mA/cm$^2$] | Voc[mV] | FF[%] | ETA[%] |
|---|---|---|---|---|
| ID 662 | −9.52 | 780 | 61 | 4.5 |
| ID 423 | −9.4 | 780 | 63 | 4.6 |

TABLE 6

Results for PS7

| Additive | Isc[mA/cm$^2$] | Voc[mV] | FF[%] | ETA[%] |
|---|---|---|---|---|
| ID662 | −8.25 | 800 | 64 | 4.3 |
| ID758 | −9.12 | 760 | 61 | 4.3 |

TABLE 7

Results for PS8

| Additive | Isc[mA/cm$^2$] | Voc[mV] | FF[%] | ETA[%] |
|---|---|---|---|---|
| ID662 | −4.68 | 840 | 68 | 2.7 |
| ID758 | −6.08 | 780 | 67 | 3.2 |

FIGS. 1, 3, 6, 10, 13, 16, 18 and 21 show measurement curves for the external quantum efficiency ("EQE"), and FIGS. 7, 8, 11, 14, 17 and 20 current-voltage characteristics of solar cells which have been produced using the inventive dyes. In the case of the measurement curves of FIGS. 2, 4, 5, 9, 12, 15, 19 and 22, some show the absorptions which arise from the overall cell construction according to the above-described steps A), B) and C), and some also only the absorptions for layer combinations according to the layers from steps A) and B), i.e. without hole conductor according to step C).

FIG. 1: Influence of additives ID662, ID750 and ID423 on the EQE of the OPV cell in the case of use of PS2

Figure 2:
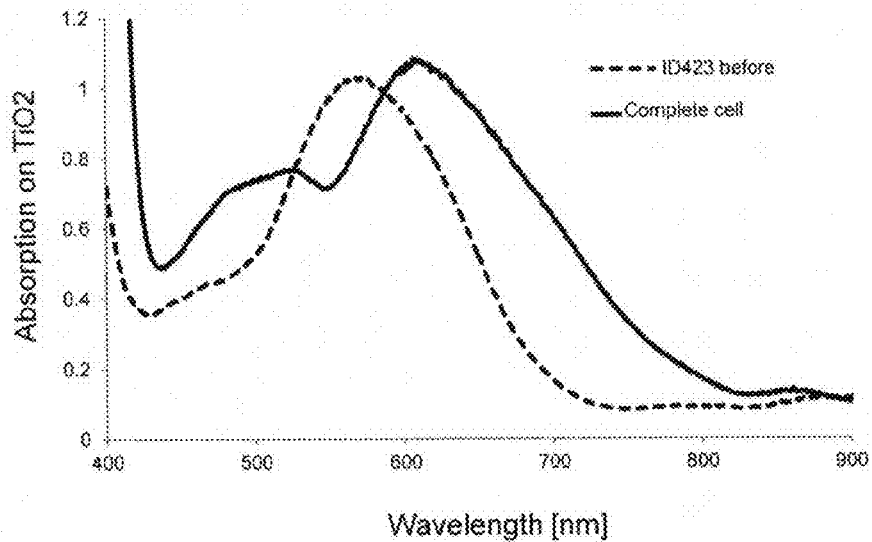
Figure 3:
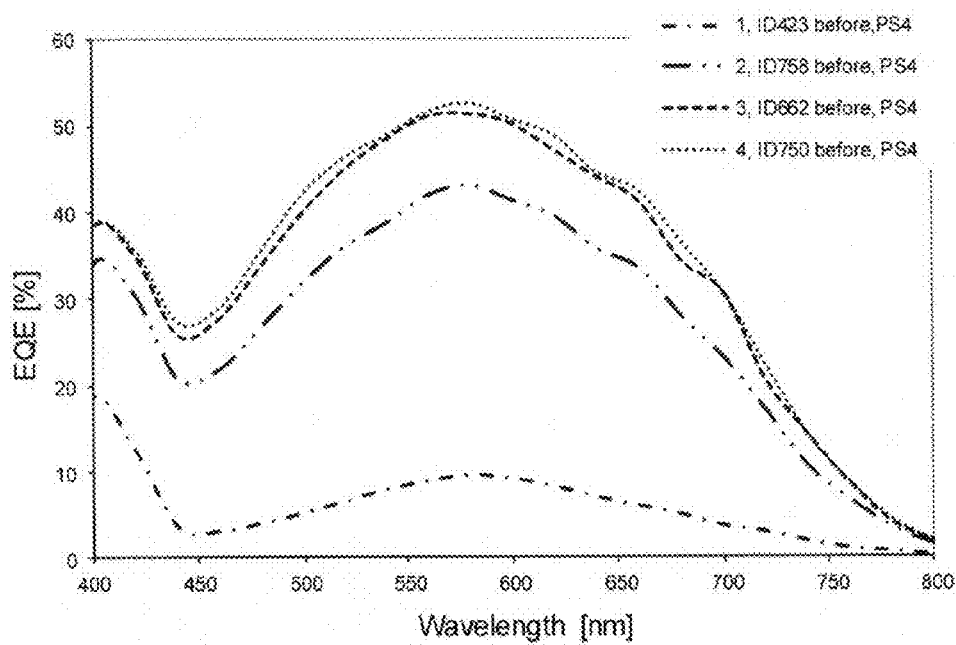

FIG. 2: Absorption of PS2/ID423 before ("before") and after the coating ("complete cell") with a hole conductor FIG. 3: Influence of additives ID423, ID758, ID662 and ID750 on the EQE of the OPV cell in the case of use of PS4

Figure 4:
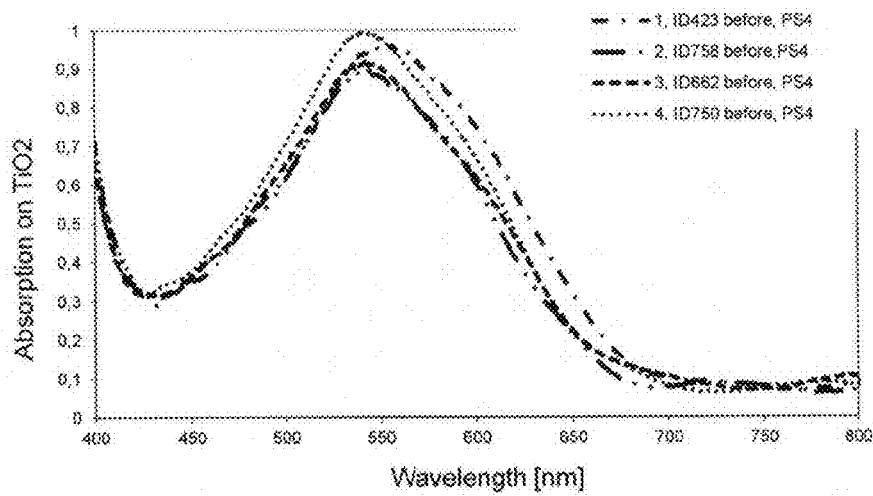
Figure 5:
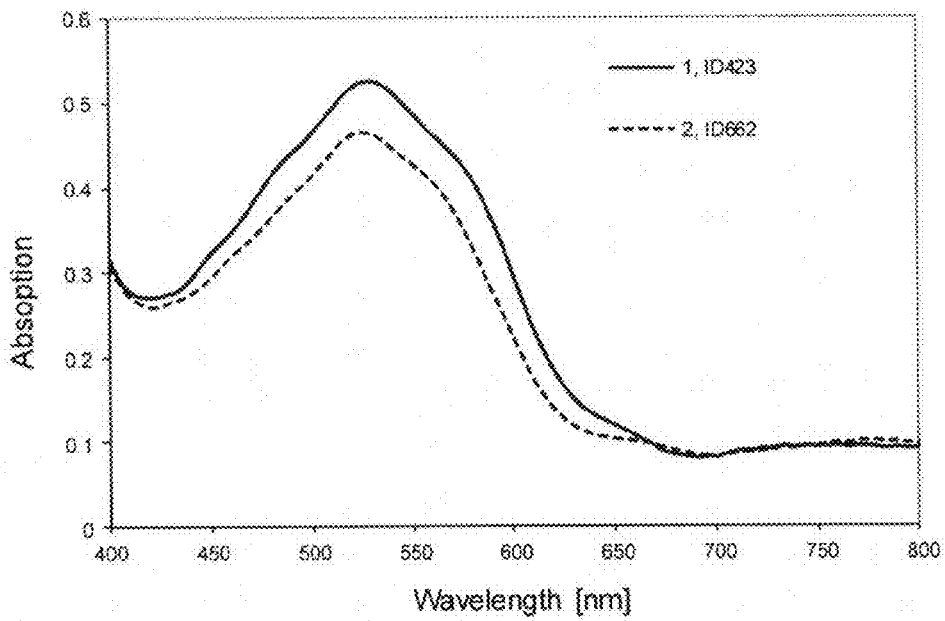
Figure 6:
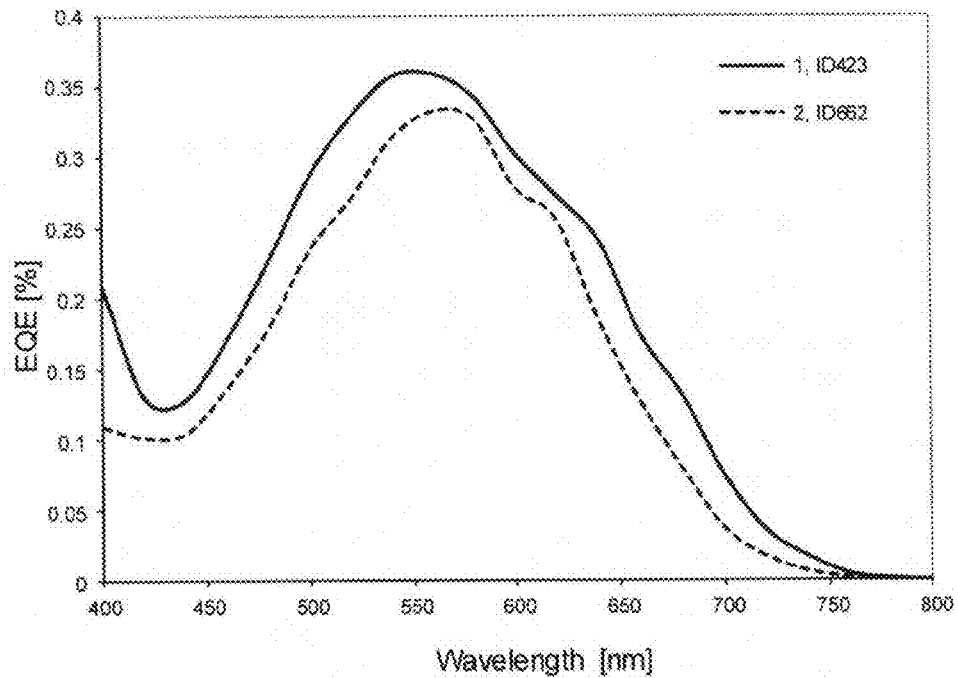

FIG. 4: Absorption of PS4 in combination with additives ID423, ID758, ID662 and ID750 before coating with a hole conductor FIG. 5: Absorption of PS1 in combination with additives ID 423 and ID 662 before coating with a hole conductor FIG. 6: Influence of additives ID 423 and ID 662 on the EQE of the OPV cell in the case of use of PS1

Figure 7:
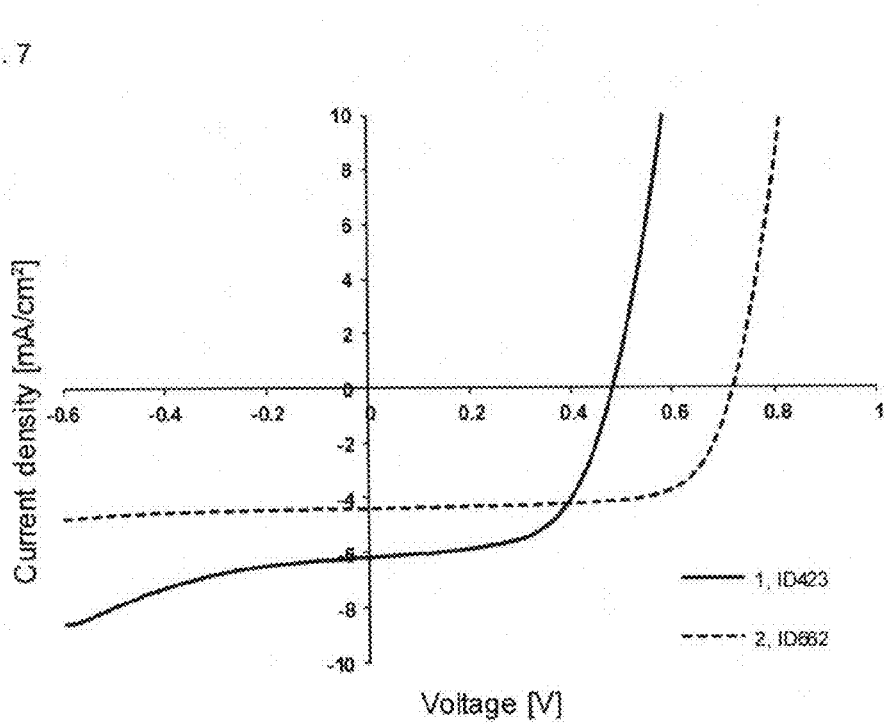

FIG. 7: Influence of additives ID 423 and ID 662 on the current-voltage characteristic of the OPV cell in the case of use of PS1

Figure 8:
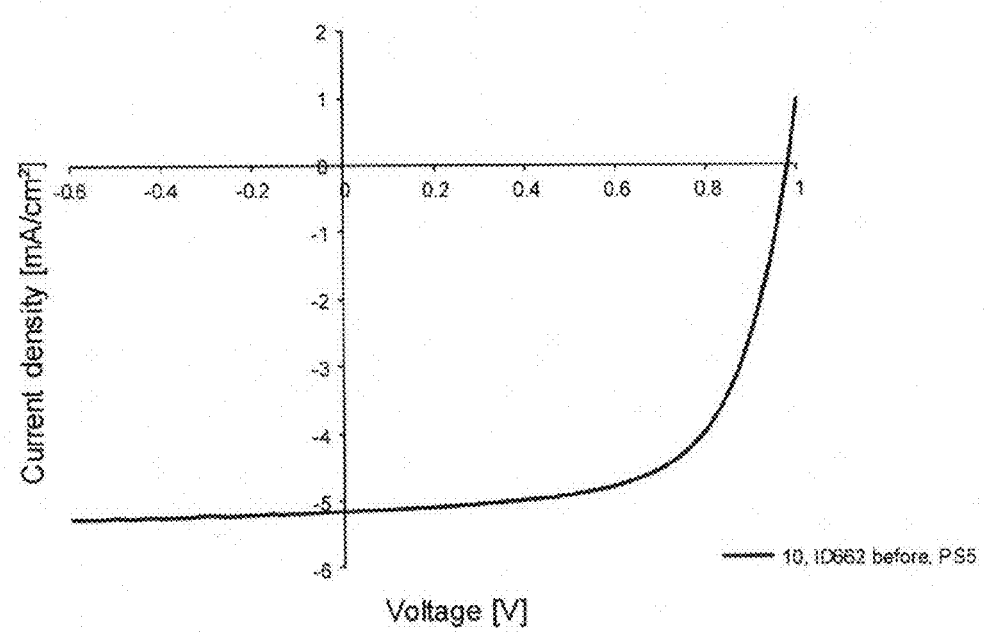

FIG. 8: Influence of ID 662 on the current-voltage characteristic of the OPV cell in the case of use of PS5

Figure 9:
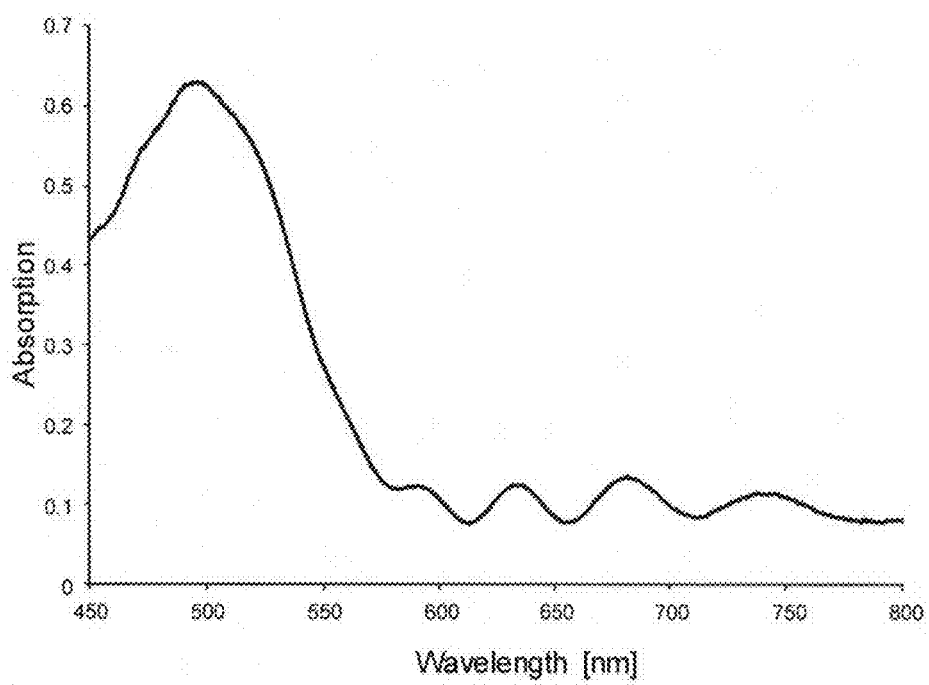
Figure 10:
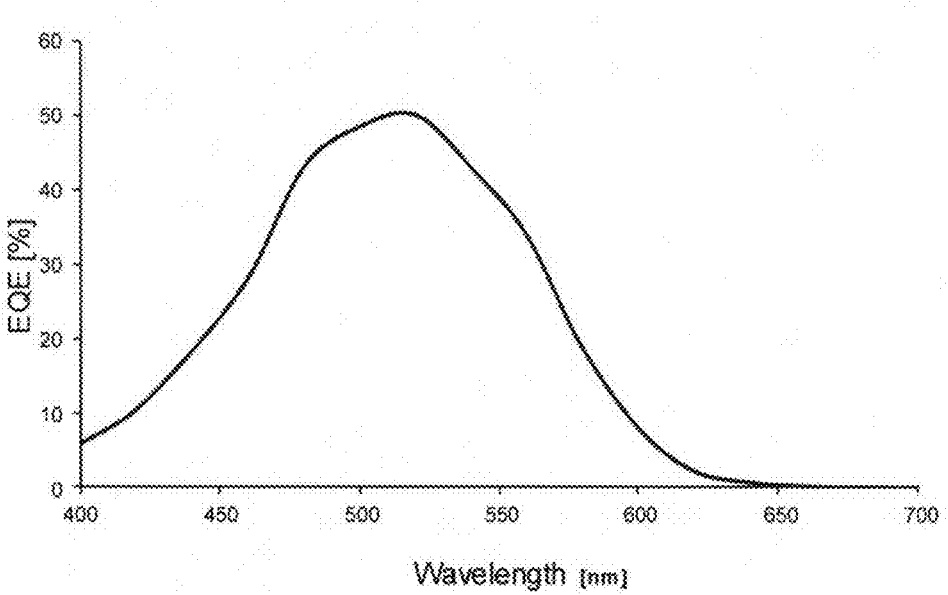

FIG. 9: Absorption of PS5 in combination with ID 662 before coating with a hole conductor FIG. 10: Influence of ID 662 on the EQE of the OPV cell in the case of use of PS5

Figure 11:
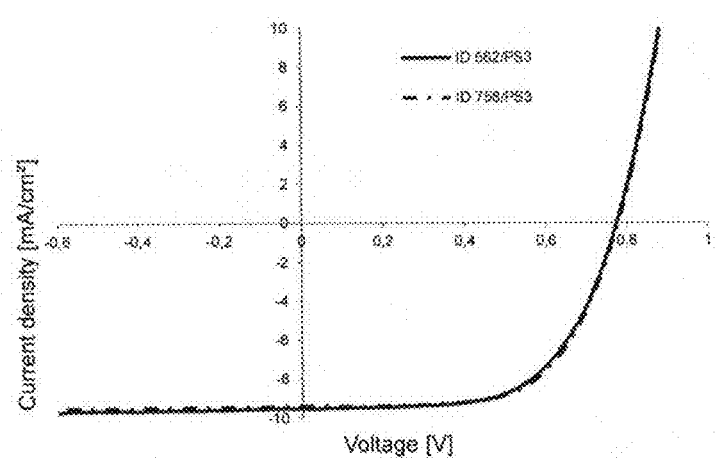

FIG. 11: Influence of additives ID 662 and ID 758 on the current-voltage characteristic of the OPV cell in the case of use of PS3

Figure 12:
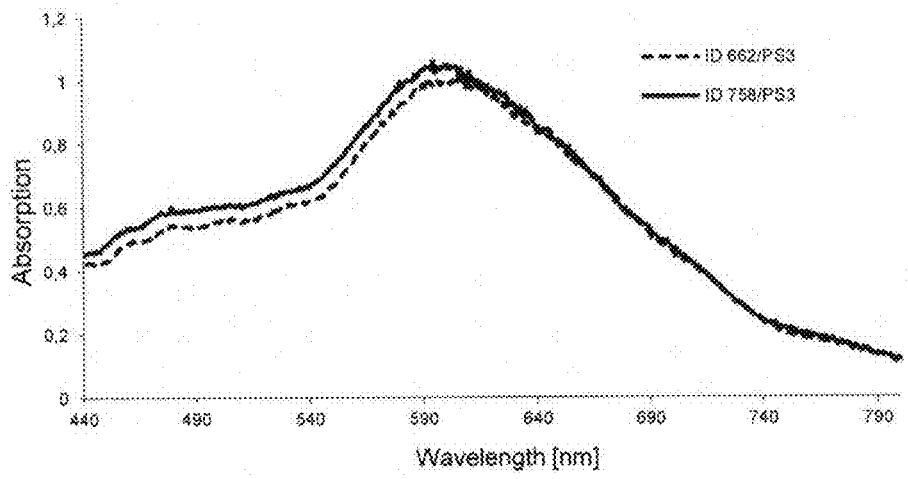
Figure 13:
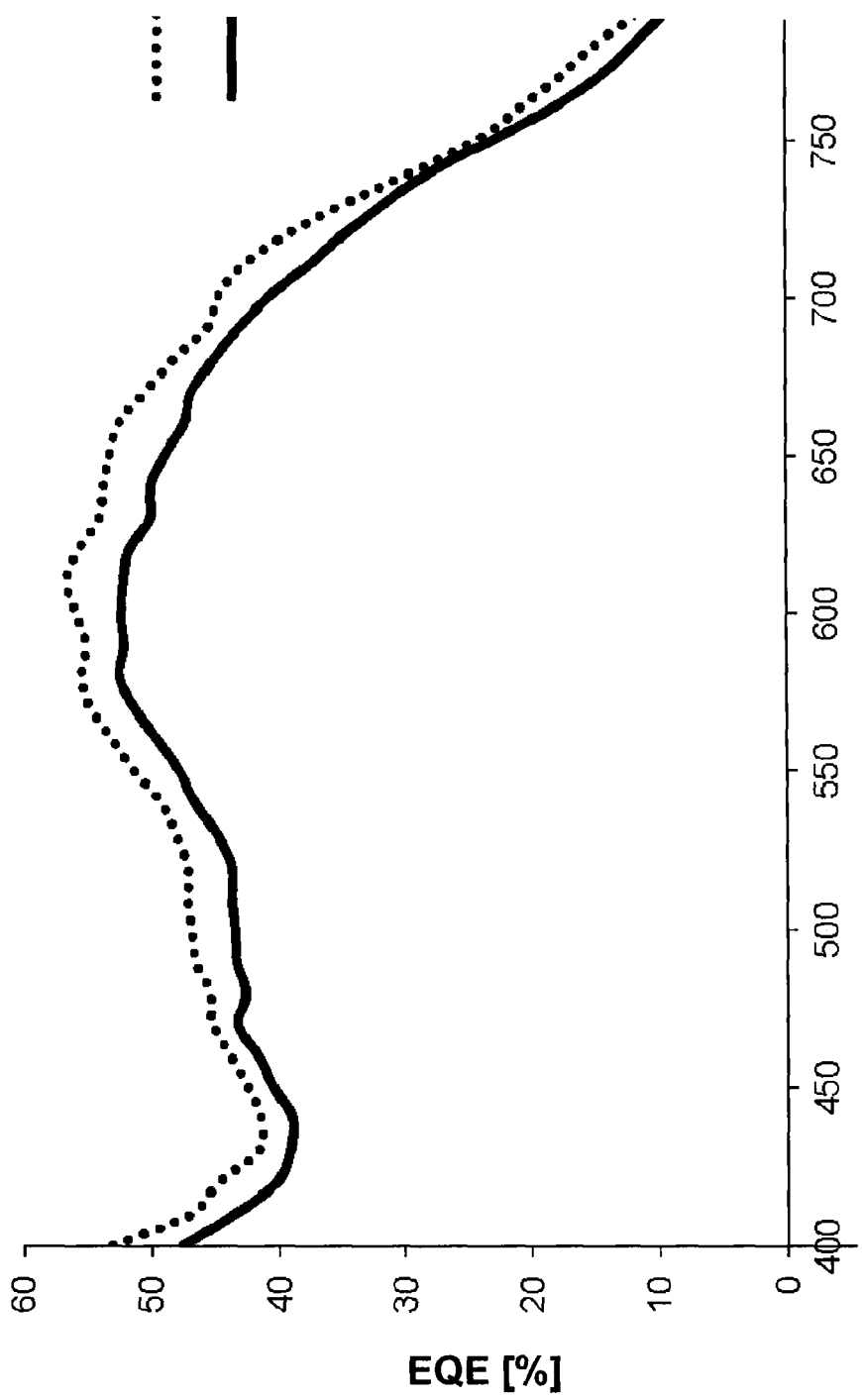

FIG. 12: Absorption of PS3 in combination with ID 758 and ID 662 before coating with a hole conductor FIG. 13: Influence of additives ID 758 and ID 662 on the EQE of the OPV cell in the case of use of PS3

Figure 14:
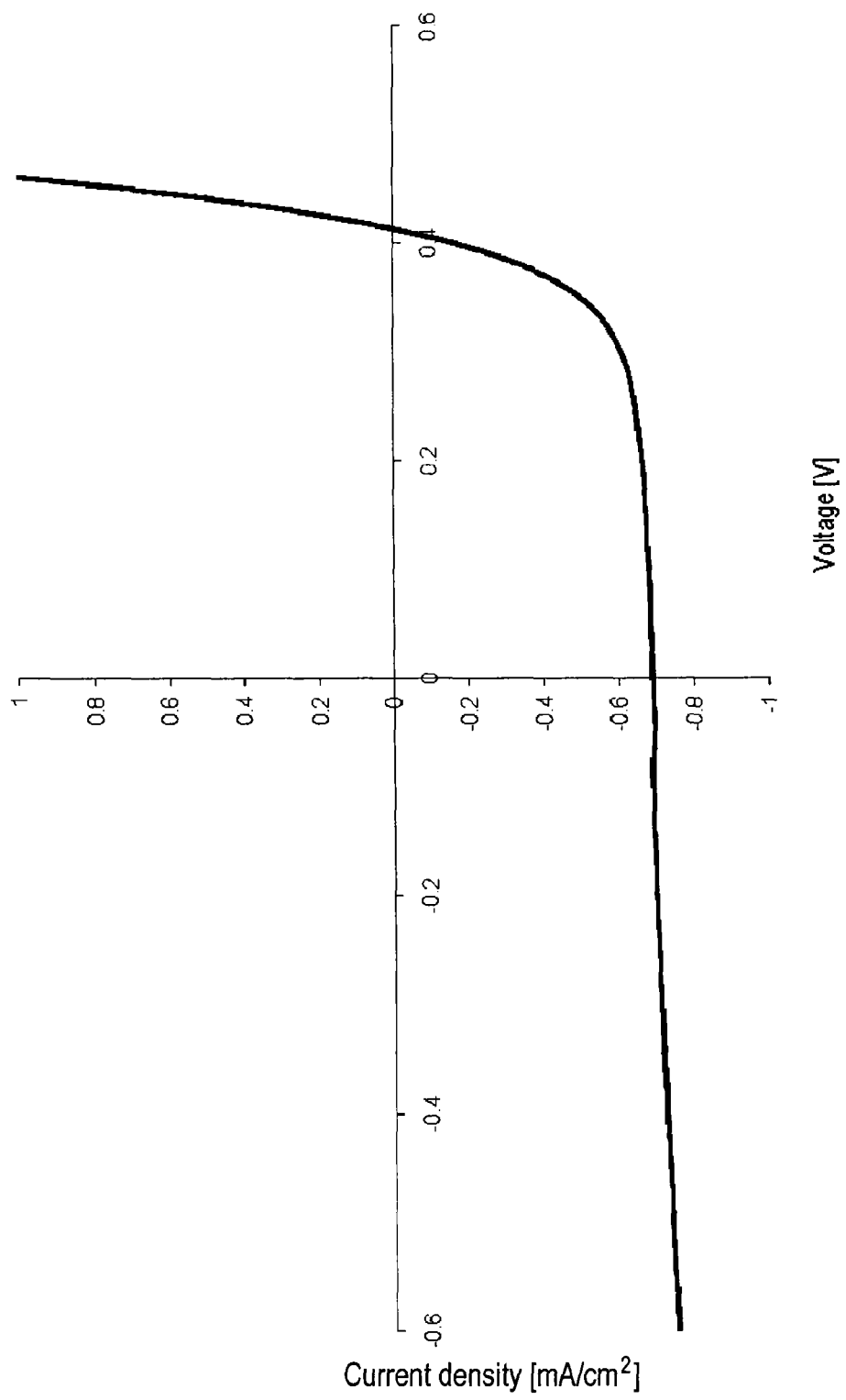

FIG. 14: Current-voltage characteristic of the OPV cell using PS6

Figure 15:
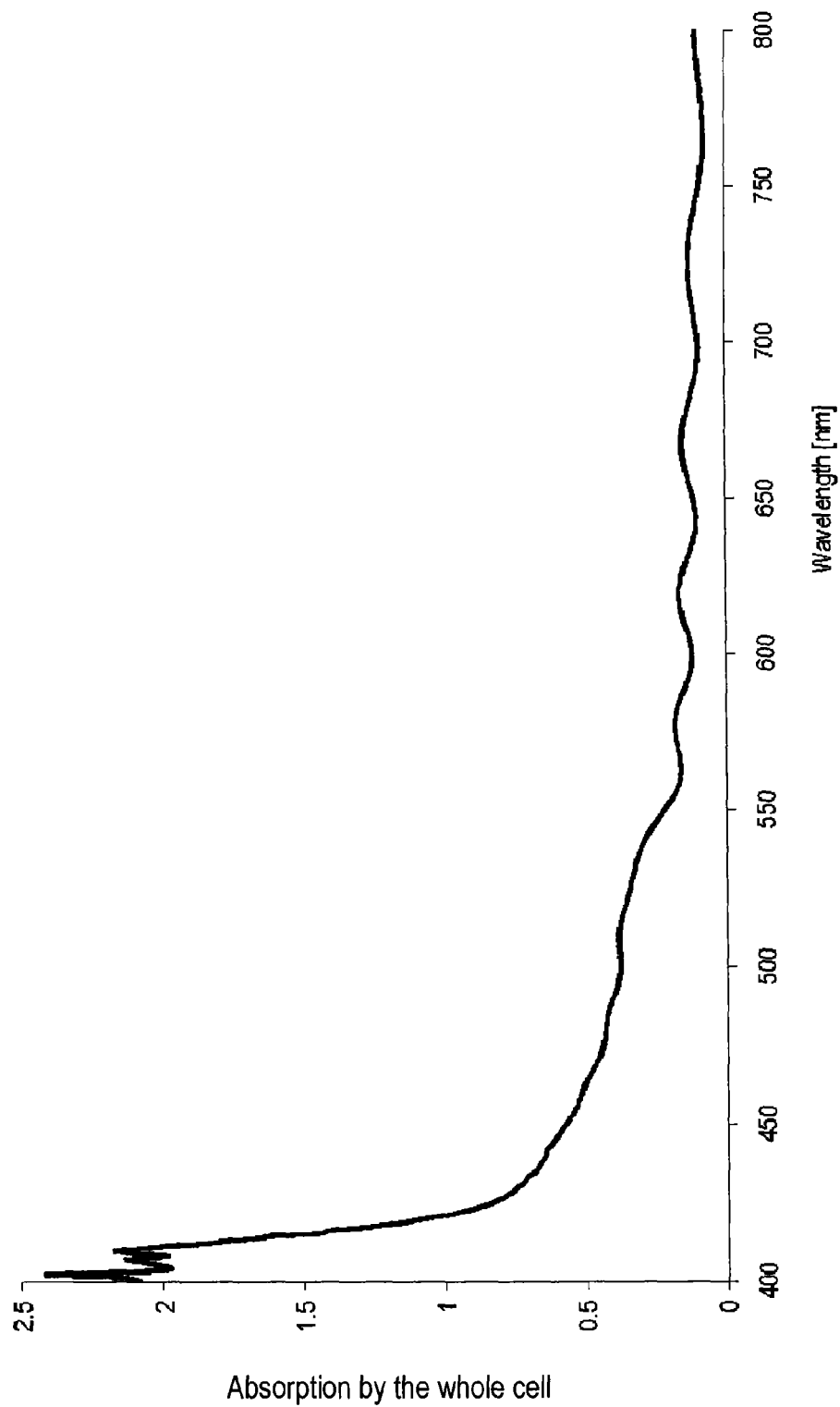

FIG. 15: Absorption of PS6 (by the whole cell)

Figure 16:
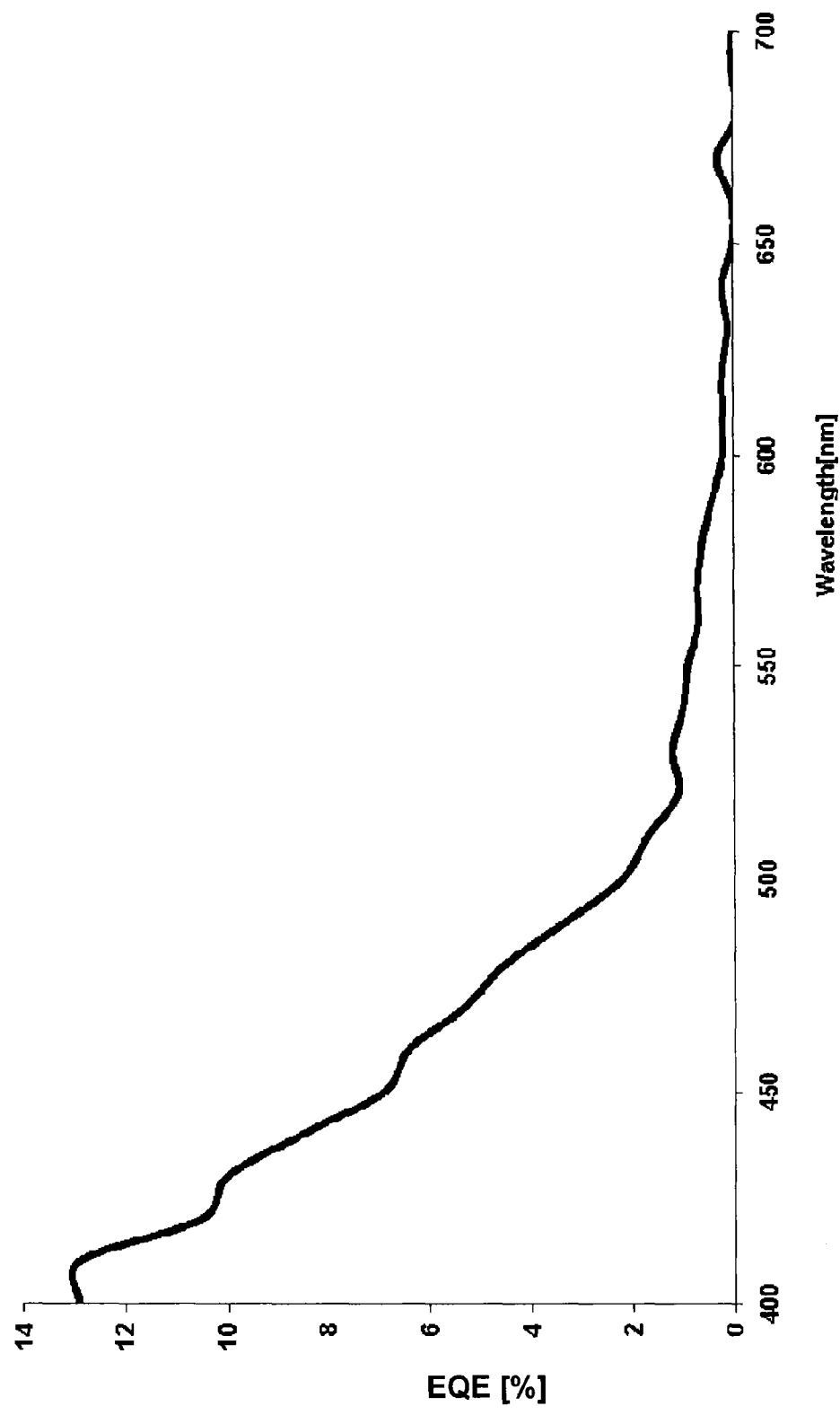

FIG. 16: EQE of the OPV cell using PS6

Figure 17:
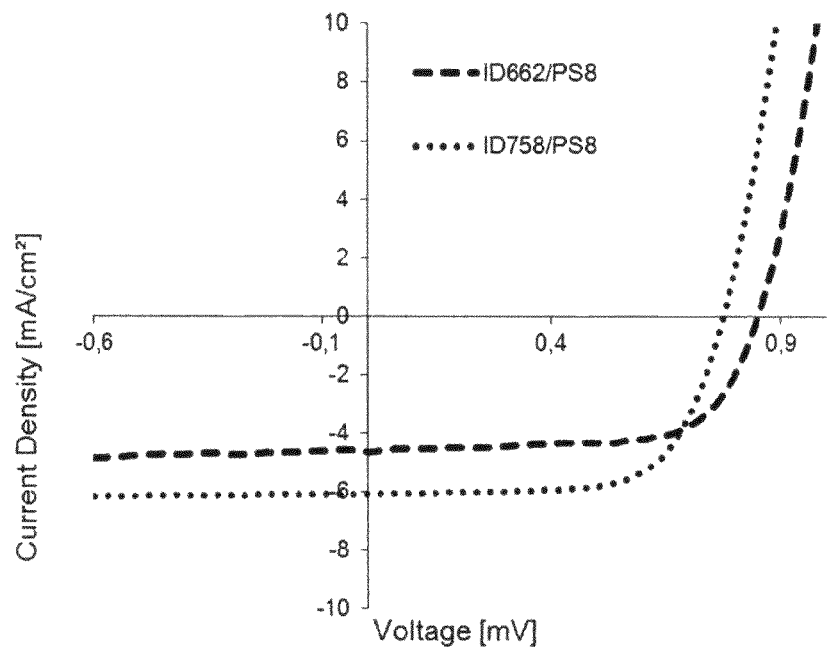

FIG. 17: Influence of additives ID 758 and ID 662 on the current-voltage characteristic of the OPV cell in the case of use of PS8

Figure 18:
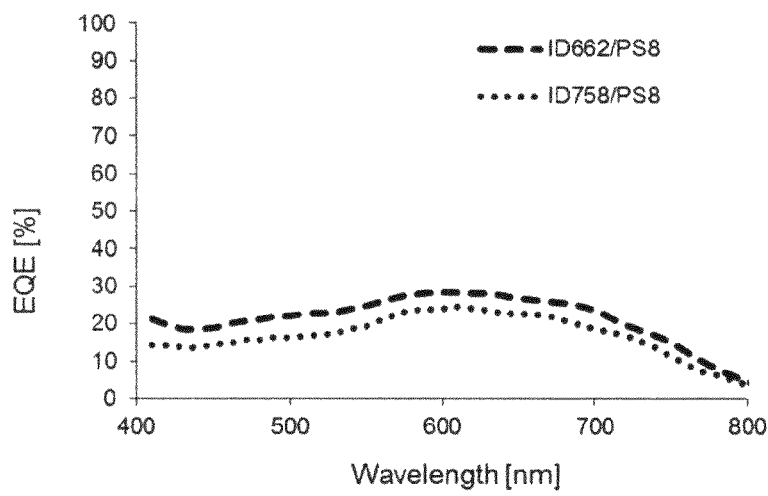

FIG. 18: Influence of additives ID 758 and ID 662 on the EQE of the OPV cell in the case of use of PS8

Figure 19:
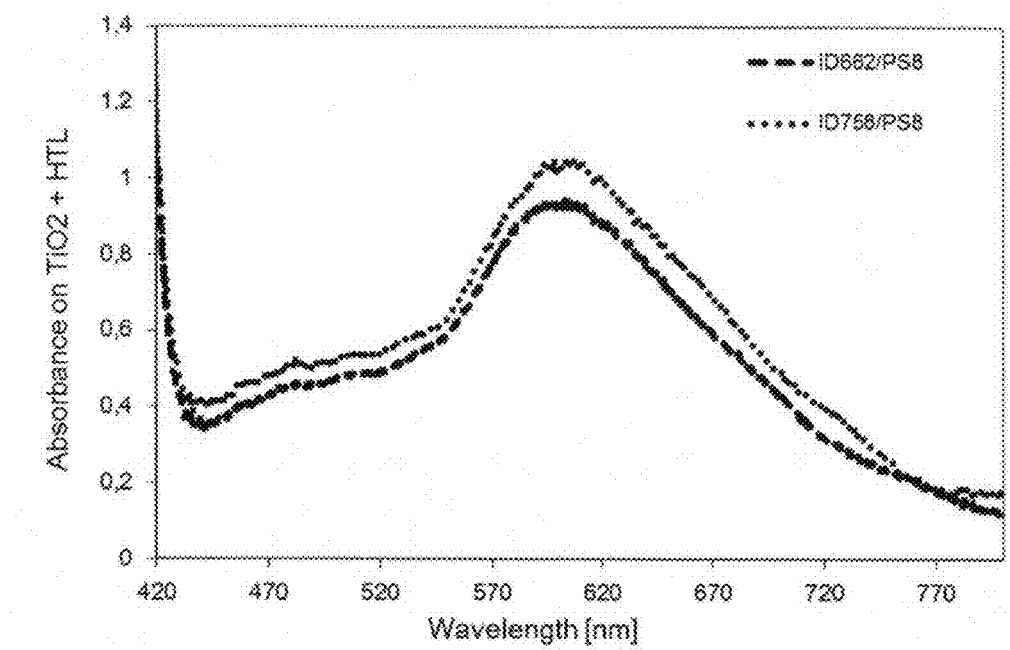

FIG. 19: Absorption of PS8 in combination with ID 758 and ID 662 after coating with a hole transporting layer (HTL)

Figure 20:
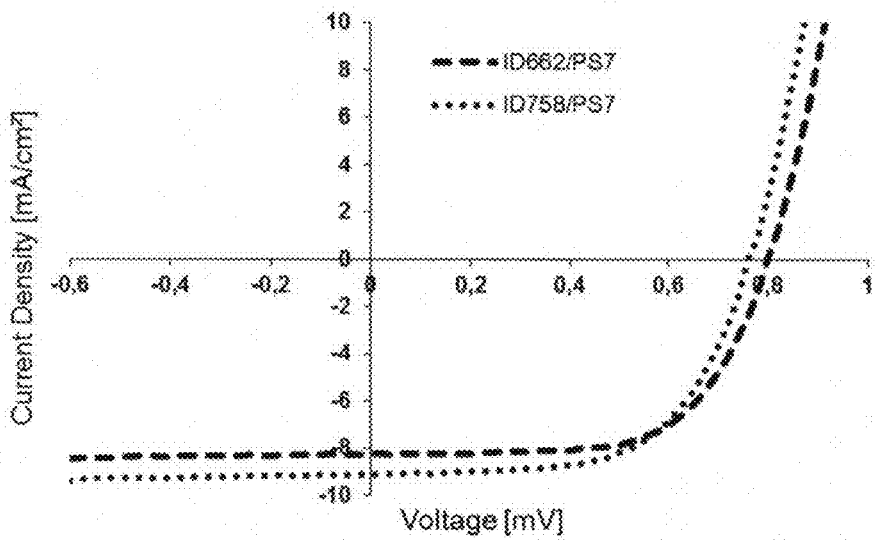

FIG. 20: Influence of additives ID 758 and ID 662 on the current-voltage characteristic of the OPV cell in the case of use of PS7

Figure 21:
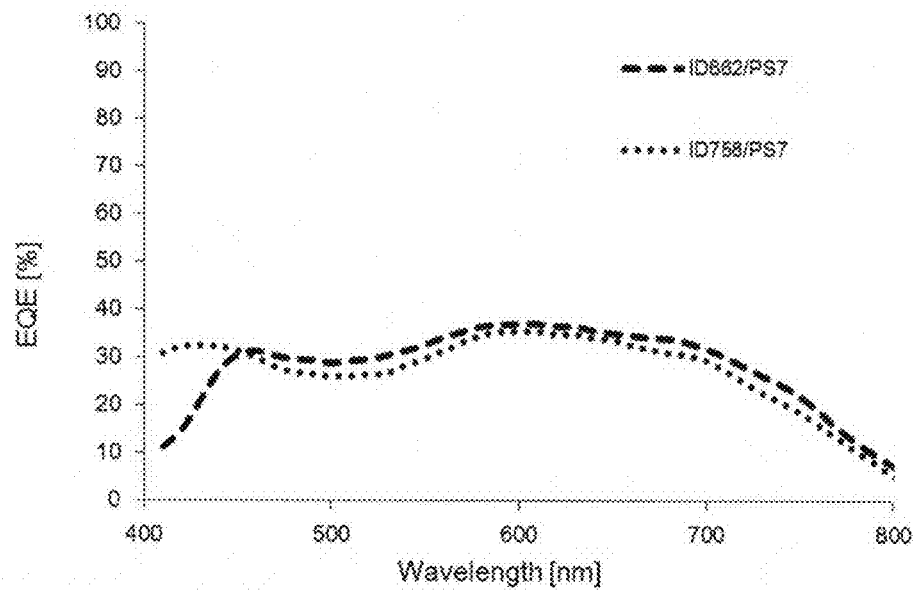

FIG. 21: Influence of additives ID 758 and ID 662 on the EQE of the OPV cell in the case of use of PS7

Figure 22:
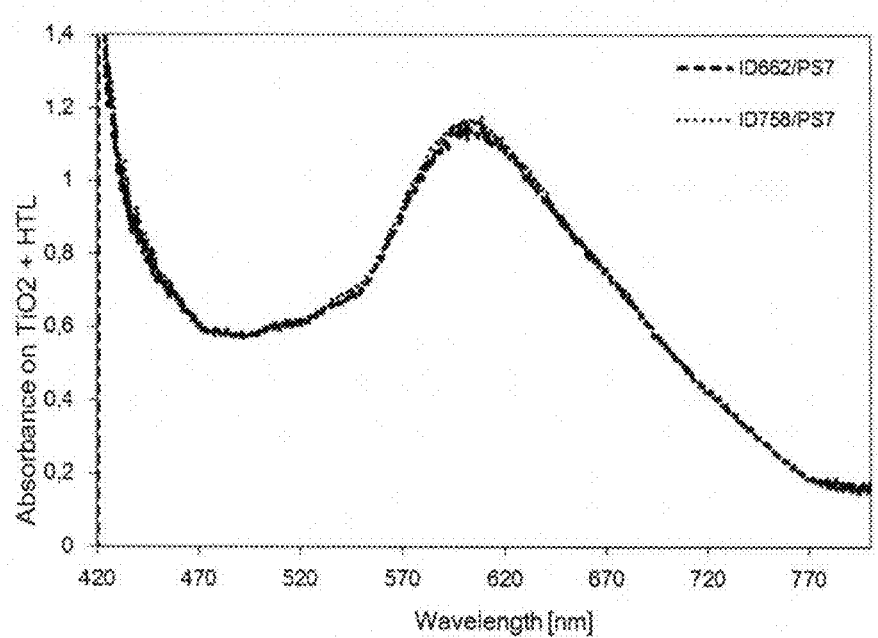

FIG. 22: Absorption of PS8 in combination with ID 758 and ID 662 after coating with a hole transporting layer (HTL)

The invention claimed is:

1. A compound of formula Ia, Ib, or Ic:

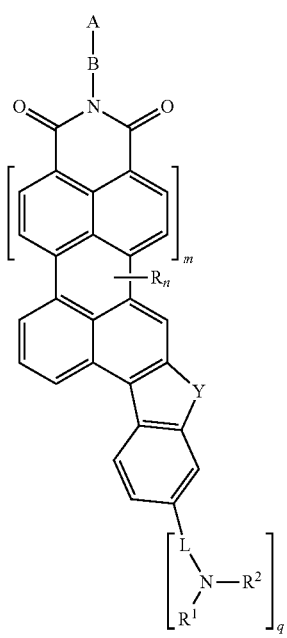

(Ia)

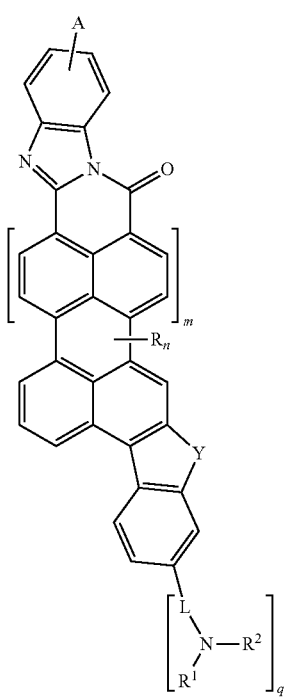

(Ib)

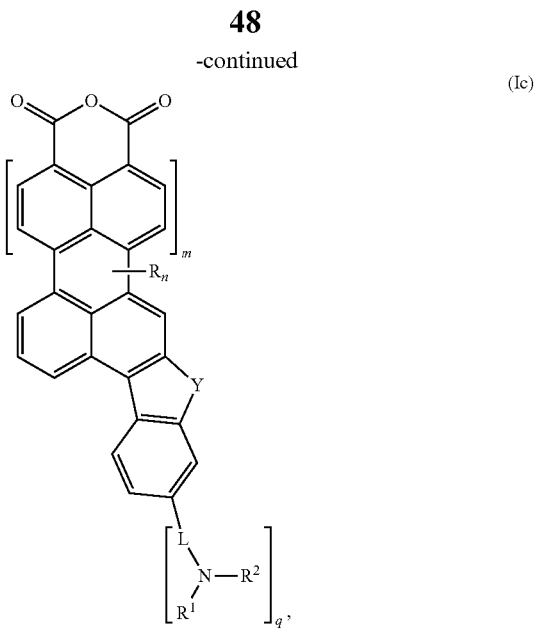

(Ic)

wherein

R is an aryloxy, arylthio, hetaryloxy, hetarylthio, aryl, diarylamino or dialkylamino radical, n when m is 0: 0, 1, 2, or 3,
when m is 1: 0, 1, 2, 3, 4, or 5, m is 0 or 1, A is —COOM, —SO$_3$M, or —PO$_3$M, M is hydrogen, an alkali metal cation or [NR']$^{4+}$, R' is hydrogen or alkyl, B is C$_1$-C$_6$-alkylene or 1,4-phenylene,
wherein a phenylene radical is optionally mono- or polysubstituted by alkyl, nitro, cyano, halogen, or a combination thereof, L is a chemical single bond or a bridge of formula:

-(Het)Ar— or -(Het)Ar-(Het)Ar— which is optionally mono- or polysubstituted by phenyl, alkyl, alkoxy, alkylthio, —NR$^4$R$^5$, or a combination thereof and in which (Het)Ar is each independently aryl or hetaryl which is optionally fused to saturated or unsaturated a 5- to 18-membered ring optionally comprising a heteroatom q is 0 or 1, R$^1$, R$^2$ are each independently a radical of formula IIa, IIb, or IIc:

(IIa)

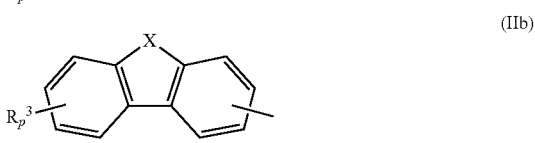

(IIb)

-continued (IIc)

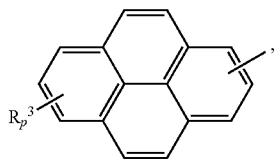

R³ is phenyl, alkyl, alkoxy, alkylthio, or —NR⁶R⁷,

X is C(R⁸R⁹)₂, NR¹⁰, oxygen, or sulfur,

R⁴ to R¹⁰ are each independently hydrogen, alkyl whose carbon chain is optionally interrupted by —O—, —S—, —CO—, —SO—, —SO₂— moiety, or a combination thereof, aryl, or hetaryl, each of which is optionally mono- or polysubstituted by alkyl, alkoxy, alkylthio, or a combination thereof, p is 0, 1, 2, 3, 4, or 5, Y is NR¹¹ or sulfur, and R¹¹ is hydrogen, alkyl whose carbon chain is optionally interrupted by —O—, —S—, —CO—, —SO—, —SO₂— moiety, or a combination thereof, aryl, hetaryl, aralkyl, or hetaralkyl.

2. The compound according to claim 1, wherein

R is an aryloxy or arylthio radical, n is 0, 1, or 2, m is 0 or 1,

A is —COOM,

M is hydrogen or an alkali metal cation,

B is C₁-C₆-alkylene,

L is a chemical single bond or a bridge of formula:

-(Het)Ar— or -(Het)Ar-(Het)Ar—, which is optionally mono- or polysubstituted by phenyl, C₁-C₁₂-alkyl, C₁-C₁₂-alkoxy, C₁-C₁₂-alkylthio, —NR⁴R⁵, or a combination thereof, and in which (Het)Ar is each independently aryl or hetaryl which is optionally fused to saturated or unsaturated a 5- to 18-membered ring optionally comprising a heteroatom, q is 0 or 1, R⁴, R⁵ are each independently hydrogen or C₁-C₁₂-alkyl whose carbon chain is optionally interrupted by —O—, —S—, —CO—, —SO—, —SO₂— moiety, or a combination thereof, R¹, R² are each independently a radical of formula II'a, II'b, or II'c:

(II'a)

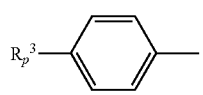

(II'b)

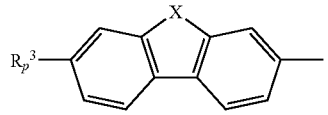

-continued (II'c)

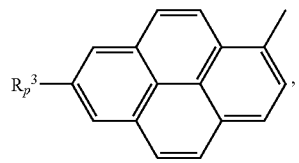

R³ is C₁-C₁₂-alkoxy, p is 0 or 1,

X is C(R⁸R⁹)₂, NR¹⁰, oxygen, or sulfur,

R⁸, R⁹, R¹⁰ are each independently hydrogen or C₁-C₁₂-alkyl whose carbon chain is optionally interrupted —O—, —S—, —CO—, —SO—, —SO₂— moiety, or a combination thereof, Y is NR¹¹ or sulfur, and R¹¹ is hydrogen or alkyl whose carbon chain is optionally interrupted by —O—, —S—, —CO—, —SO—, —SO₂— moiety, or a combination thereof.

3. A solar cell or photodetector, comprising the compound according to claim 2, a mixture thereof, an isomer thereof, or an isomer of the mixture thereof, as a photosensitizer.

4. A method for producing a photosensitizer in a solar cell or a photodetector, the method comprising:

producing the solar cell or a photodetector with the compound according to claim 2, a mixture thereof, an isomer thereof, or an isomer of the mixture thereof.

5. The compound according to claim 1, wherein n is 0, m is 0 or 1,

A is —COOM,

M is hydrogen or an alkali metal cation,

B is C₁-C₆-alkylene,

L is a chemical single bond or a bridge of formula:

-(Het)Ar— or -(Het)Ar-(Het)Ar—, wherein (Het)Ar is each independently aryl or hetaryl, q is 0 or 1, R¹, R² are each independently a radical of formula II'a, II'b, or II'c:

(II'a)

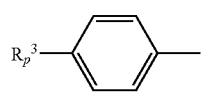

(II'b)

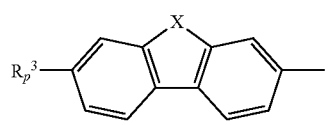

(II'c)

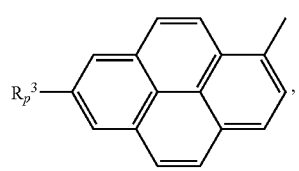

R³ is C₁-C₁₂-alkoxy, p is 0 or 1,

X is C(R⁸R⁹)₂ or NR¹⁰,

R⁸, R⁹, R¹⁰ are each independently hydrogen or C₁-C₁₂-alkyl whose carbon chain is optionally interrupted by —O—, —S—, —CO—, —SO—, —SO₂— moiety, or a combination thereof, Y is $NR^{11}$ or sulfur, and
$R^{11}$ is hydrogen or $C_1$-$C_{12}$-alkyl.

6. A solar cell or photodetector, comprising the compound according to claim 5, a mixture thereof, an isomer thereof, or an isomer of the mixture thereof, as a photosensitizer.

7. A method for producing a photosensitizer in a solar cell or a photodetector, the method comprising:
    producing the solar cell or a photodetector with the compound according to claim 3, a mixture thereof, an isomer thereof, or an isomer of the mixture thereof.

8. A solar cell or photodetector, comprising the compound according to claim 1, a mixture thereof, an isomer thereof, or an isomer of the mixture thereof, as a photosensitizer.

9. A method for producing a photosensitizer in a solar cell or a photodetector, the method comprising:
    producing the solar cell or a photodetector with the compound according to claim 1, a mixture thereof, an isomer thereof, or an isomer of the mixture thereof.

\* \* \* \* \*

UNITED STATES PATENT AND TRADEMARK OFFICE
CERTIFICATE OF CORRECTION

PATENT NO.         : 9,054,325 B2
APPLICATION NO.    : 13/762764
DATED              : *June 9, 2015
INVENTOR(S)        : Flavio Luiz Benedito et al.

Page 1 of 1

It is certified that error appears in the above-identified patent and that said Letters Patent is hereby corrected as shown below:

On the title page, Item (73), the Assignees' Information is incorrect. Item (73) should read:

--(73) Assignees: BASF SE, Ludwigshafen (DE);
          Max-Planck-Gesellschaft zur
          Foerderung der Wissenschaften e.V.,
          Muenchen, (DE)--

Signed and Sealed this
Ninth Day of August, 2016

Michelle K. Lee
*Director of the United States Patent and Trademark Office*